United States Patent
Luo et al.

(10) Patent No.: US 11,785,821 B2
(45) Date of Patent: Oct. 10, 2023

(54) DISPLAY SUBSTRATE AND RELATED DEVICE

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Chang Luo, Beijing (CN); Ming Hu, Beijing (CN); Qian Xu, Beijing (CN); Jianpeng Wu, Beijing (CN); Tong Niu, Beijing (CN); Yan Huang, Beijing (CN); Guomeng Zhang, Beijing (CN); Benlian Wang, Beijing (CN); Peng Xu, Beijing (CN); Fengli Ji, Beijing (CN); Yi Zhang, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 256 days.

(21) Appl. No.: 17/417,336

(22) PCT Filed: Sep. 30, 2020

(86) PCT No.: PCT/CN2020/119231
§ 371 (c)(1),
(2) Date: Jun. 22, 2021

(87) PCT Pub. No.: WO2022/052194
PCT Pub. Date: Mar. 17, 2022

(65) Prior Publication Data
US 2022/0336539 A1 Oct. 20, 2022

(30) Foreign Application Priority Data

Sep. 10, 2020 (WO) ................ PCT/CN2020/114261

(51) Int. Cl.
*H01L 27/32* (2006.01)
*H01L 51/56* (2006.01)
(Continued)

(52) U.S. Cl.
CPC .......... *H10K 59/353* (2023.02); *H10K 71/00* (2023.02); *H10K 59/122* (2023.02); *H10K 59/352* (2023.02)

(58) Field of Classification Search
CPC .......................... H10K 59/352; H10K 59/353
See application file for complete search history.

(56) References Cited

U.S. PATENT DOCUMENTS

| 2014/0175390 A1* | 6/2014 | Kim | ........................ H10K 50/80 438/34 |
| 2018/0062107 A1* | 3/2018 | Kim | ..................... H10K 59/131 |

(Continued)

FOREIGN PATENT DOCUMENTS

| CN | 109994506 A | * | 7/2019 | ........... C23C 14/042 |
| CN | 111341815 A | * | 6/2020 | ............. H10K 50/16 |
| WO | WO-2019153948 A1 | * | 8/2019 | ......... G02F 1/13394 |

OTHER PUBLICATIONS

Machine translation, Xiao, Chinese Pat. Pub. No. CN109994506, translation date: May 1, 2023, Clarivate Analytics, all pages. (Year: 2023).*

(Continued)

*Primary Examiner* — Victoria K. Hall
(74) *Attorney, Agent, or Firm* — BROOKS KUSHMAN P.C.

(57) ABSTRACT

A display substrate and a related device, and belongs to the field of display technology. The display substrate includes first subpixels, a second subpixels and third subpixels. In a first direction, the first subpixels and the third subpixels are arranged alternately to form a plurality of first subpixel
(Continued)

rows, the second subpixels form a plurality of second subpixel rows, the first subpixel rows and the second subpixel rows are arranged alternately in a second direction, lines connecting centers of two first subpixels and two third subpixels in two adjacent rows and two adjacent columns form a first virtual quadrilateral, the two first subpixels are arranged at two opposite vertices of the first virtual quadrilateral, the first virtual quadrilateral includes an interior angle a not equal to 90°, and the second subpixel is arranged within the first virtual quadrilateral.

19 Claims, 7 Drawing Sheets

(51) Int. Cl.
*H10K 59/35* (2023.01)
*H10K 71/00* (2023.01)
H10K 59/122 (2023.01)

(56) References Cited

U.S. PATENT DOCUMENTS

| | | | | |
|---|---|---|---|---|
| 2018/0342571 | A1* | 11/2018 | Kwon | G09G 3/3233 |
| 2019/0252469 | A1* | 8/2019 | Xiao | H10K 59/122 |
| 2020/0273924 | A1* | 8/2020 | Xiao | C23C 14/042 |
| 2021/0313402 | A1* | 10/2021 | Zhou | H10K 59/353 |

OTHER PUBLICATIONS

Machine translation, Liu, Chinese Pat. Pub. No. CN111341815, translation date: May 1, 2023, Clarivate Analytics, all pages. (Year: 2023).*
Machine translation, Liu, WIPO Pat. Pub. No. WO2019/0153948, translation date: May 1, 2023, Clarivate Analytics, all pages. (Year: 2023).*
International Searching Authority, Translation, Written Opinion of International Searching Authority, International application No. PCT/CN2020/119231, dated Jun. 9, 2021, all pages. (Year: 2021).*
International Searching Authority, Translation, International Search Report, International application No. PCT/CN2020/119231, dated Jun. 9, 2021, all pages. (Year: 2021).*

* cited by examiner

DISPLAY SUBSTRATE AND RELATED DEVICE

CROSS-REFERENCE TO RELATED APPLICATIONS

This application is the U.S. national phase of PCT Application No. PCT/CN2020/119231 filed on Sep. 30, 2020, which claims priority to PCT application No. PCT/CN2020/114621 filed on Sep. 10, 2020, which are incorporated herein by reference in their entireties.

TECHNICAL FIELD

The present disclosure relates to the field of display technology, in particular to a display substrate, an Organic Light-Emitting Diode (OLED) display panel, a fine metal mask and a display device.

BACKGROUND

An OLED display device is one of the research focuses in the field of tablet display. As compared with a liquid crystal display device, the OLED display device has such advantages as low power consumption, low manufacture cost, self-luminescence, wide viewing angle and rapid response. Currently, in the field of tablet display, the OLED display device has gradually replaced a conventional Liquid Crystal Display (LCD) panel.

The OLED display device mainly includes a base substrate, and a plurality of pixels arranged in an array form on the base substrate. Usually, the pixels are OLED structures formed through evaporating an organic material at corresponding pixel positions on an array substrate using a fine metal mask.

A size of a sub-pixel directly depends on a size of an opening of the fine metal mask. However, due to the limitation of a manufacture process of the fine metal mask, it is very difficult to acquire a high-resolution display device based on the current display panel.

SUMMARY

A technical problem to be solved by the present disclosure is to provide a display substrate, an OLED display panel, a fine metal mask and a display device, so as to improve the resolution of the display device.

In order to solve the above-mentioned problem, the present disclosure provides the following technical solutions.

In one aspect, the present disclosure provides a display substrate, including a plurality of first subpixels, a plurality of second subpixels and a plurality of third subpixels, wherein in a first direction, the first subpixels and the third subpixels are arranged alternately to form a plurality of first subpixel rows, and the second subpixels form a plurality of second subpixel rows; the first subpixel rows and the second subpixel rows are arranged alternately in a second direction, lines connecting centers of two first subpixels and two third subpixels in two adjacent rows and two adjacent columns form a first virtual quadrilateral, the two first subpixels are arranged at respective two opposite vertices of the first virtual quadrilateral, the first virtual quadrilateral includes an interior angle a being not equal to 90°, and the second subpixel is arranged within the first virtual quadrilateral; and in the first virtual quadrilateral, a distance between an orthogonal projection of a center of a first subpixel onto a first straight line and an orthogonal projection of a center of a third subpixel onto the first straight line is x, where the first subpixel and the third subpixel are arranged in different first subpixel rows, and the first straight line is parallel to the first direction; a distance between an orthogonal projection of a center of a first subpixel onto a second straight line and an orthogonal projection of a center of a third subpixel onto the second straight line is y, where the first subpixel and the third subpixel are arranged in a same first subpixel row, and the second straight line is parallel to the second direction; the interior angle a of the first virtual quadrilateral is within a range of (h−10°, h+10°, and h is calculated through any one of the following equations:

$$h = 90° - \arctan\left(\frac{x}{P}\right) - \arctan\left(\frac{y}{P}\right);$$

$$h = 90° + \arctan\left(\frac{x}{P}\right) + \arctan\left(\frac{y}{P}\right);$$

$$h = 90 - \left|\arctan\left(\frac{x}{P}\right) - \arctan\left(\frac{y}{P}\right)\right|;$$

$$h = 90° + \left|\arctan\left(\frac{x}{P}\right) - \arctan\left(\frac{y}{P}\right)\right|;$$

where P represents a distance between centers of two second subpixels proximate to each other in the second subpixel row.

In some embodiments of the present disclosure, x is within a range of 1 μm to 10 μm, and y is within a range of 1 μm to 10 μm.

In some embodiments of the present disclosure, the interior angle a is greater than or equal to 70° and smaller than 90°.

In some embodiments of the present disclosure, a line connecting centers of the first subpixel and the third subpixel adjacent to each other in the first direction is parallel to the first direction, and a line connecting centers of the first subpixel and the third subpixel adjacent to each other in the second direction is parallel to the second direction; or the line connecting the centers of the first subpixel and the third subpixel adjacent to each other in the first direction is parallel to the first direction, the line connecting the centers of the first subpixel and the third subpixel adjacent to each other in the second direction is angled relative to the second direction at an angle c, and the angle c is greater than 0° and not equal to 90°; or the line connecting the centers of the first subpixel and the third subpixel adjacent to each other in the first direction is angled relative to the first direction at an angle d, the line connecting the centers of the first subpixel and the third subpixel adjacent to each other in the second direction is angled relative to the second direction at an angle e, the angle d is greater than 0° and not equal to 90°, and the angle e is greater than 0° and not equal to 90°.

In some embodiments of the present disclosure, the first direction is approximately perpendicular to the second direction, the first direction is one of a row direction and a column direction, and the second direction is the other one of the row direction and the column direction.

In some embodiments of the present disclosure, a shape of the second subpixel is selected from any one of a polygon, an axisymmetric pattern and a centrosymmetric pattern, the shape of the second subpixel is provided with a length direction, the length direction of the second subpixel is an extension direction of a longest side of the polygon, a direction of a long axis of the axisymmetric pattern, or a direction of a line connecting two end points of a group of opposite and parallel sides of the centrosymmetric pattern, the two end points are at a same side of a symmetric center, and the length direction of the second subpixel crosses the first direction and the second direction, wherein x=0, a size L' of the second subpixel in the length direction of the second subpixel approximately satisfies L'=(L+y/√2)±5 µm, and a size M' of the second subpixel in a width direction of the second subpixel approximately satisfies M'=(M−y/√2)±5 µm; or a size L' of the second subpixel in the width direction of the second subpixel approximately satisfies L'=(L y/√2)±5 µm, and a size M' of the second subpixel in the length direction of the second subpixel approximately satisfies M'=(M+y/√2)±5 µm; or wherein y=0, the size L' of the second subpixel in the length direction of the second subpixel approximately satisfies L'=(L+x/√2)±5 µm, and the size M' of the second subpixel in the width direction of the second subpixel approximately satisfies M'=(M−x/√2)±5 µm; or the size L' of the second subpixel in the width direction of the second subpixel approximately satisfies L'=(L−x/√2)±5 µm, and the size M' of the second subpixel in its length direction of the second subpixel approximately satisfies M'=(M+x/√2)±5 µm, wherein the width direction and the length direction of the same second subpixel are approximately perpendicular to each other, and each of L and M has a preset value.

In some embodiments of the present disclosure, a shape of the second subpixel is provided with a length direction, the second subpixel has a maximum size in the length direction of the second subpixel, the length direction of the second subpixel crosses the first direction and the second direction, x is greater than 0, and y is greater than 0, wherein a size L' of the second subpixel in the length direction of the second subpixel approximately satisfies $$L' = \left(L + \frac{x}{\sqrt{2}} - \frac{y}{\sqrt{2}}\right) \pm 5 \ \mu m,$$

and a size M' of the second subpixel in a width direction of the second subpixel approximately satisfies $$M' = \left(M - \frac{x}{\sqrt{2}} + \frac{y}{\sqrt{2}}\right) \pm 5 \ \mu m;$$

or the size L' of the second subpixel in the length direction of the second subpixel approximately satisfies $$L' = \left(L + \frac{x}{\sqrt{2}} + \frac{y}{\sqrt{2}}\right) \pm 5 \ \mu m,$$

and the size M' of the second subpixel in the width direction of the second subpixel approximately satisfies $$M' = \left(M - \frac{x}{\sqrt{2}} - \frac{y}{\sqrt{2}}\right) \pm 5 \ \mu m;$$

or the size L' of the second subpixel in the length direction of the second subpixel approximately satisfies $$L' = \left(L - \frac{x}{\sqrt{2}} - \frac{y}{\sqrt{2}}\right) \pm 5 \ \mu m,$$

and the size M' of the second subpixel in the width direction of the second subpixel approximately satisfies $$M' = \left(M + \frac{x}{\sqrt{2}} + \frac{y}{\sqrt{2}}\right) \pm 5 \ \mu m;$$

or the size L' of the second subpixel in the length direction of the second subpixel approximately satisfies $$L' = \left(L - \frac{x}{\sqrt{2}} + \frac{y}{\sqrt{2}}\right) \pm 5 \ \mu m,$$

and the size M' of the second subpixel in the width direction of the second subpixel approximately satisfies $$M' = \left(M + \frac{x}{\sqrt{2}} - \frac{y}{\sqrt{2}}\right) \pm 5 \ \mu m,$$

where each of L and M has a preset value.

In some embodiments of the present disclosure, a value of L is within a range of 10 µm to 50 µm, and a value of M is within a range of 5 µm to 40 µm.

In some embodiments of the present disclosure, sides of four first virtual quadrilaterals arranged in two columns and two rows are shared to form a second virtual polygon, and the second virtual polygon includes four second subpixels, five first subpixels and four third subpixels;

the four second subpixels are arranged in the four first virtual quadrilaterals respectively, one of the first subpixels is surrounded by the four second subpixels, the other four first subpixels and the four third subpixels are arranged alternately and respectively at sides or vertices of the second virtual polygon in a clockwise or counterclockwise direction of sides of the second virtual polygon; and lines connecting centers of the four first subpixels at the sides or vertices of the second virtual polygon approximately form a virtual parallelogram, and/or lines connecting centers of the four third subpixels at the sides or vertices of the second virtual polygon approximately form a virtual parallelogram, and/or lines connecting centers of the four second subpixels in the four first virtual quadrilaterals approximately form a virtual parallelogram.

In some embodiments of the present disclosure, a line connecting the centers of at least a part of the first subpixels is approximately arranged on a third straight line, a line connecting the centers of at least a part of the first subpixels is approximately arranged on a fourth straight line, and the third straight line is approximately parallel to the fourth straight line.

In some embodiments of the present disclosure, the third straight line does not coincide with the fourth straight line, and both the third straight line and the fourth straight line are approximately parallel to the first direction; or the third straight line does not coincide with the fourth straight line, and both the third straight line and the fourth straight line are approximately parallel to the second direction.

In some embodiments of the present disclosure, a line connecting the centers of at least a part of the second subpixels in a same second pixel row is approximately arranged on a fifth straight line, and the fifth straight line is approximately parallel to the third straight line and the fourth straight line.

In some embodiments of the present disclosure, the four first virtual quadrilaterals in the same second virtual polygon include a first one and a second one, an absolute value of a difference between a minimum interior angle of the first one and 90° is smaller than an absolute value of a difference between a minimum interior angle of the second one and 90°, a width-to-length ratio of the second subpixel in the first one is greater than a width-to-length ratio of the second subpixel in the second one.

In some embodiments of the present disclosure, the display substrate includes a plurality of pixel repetition units, the pixel repetition unit includes two first subpixels and two third subpixels in the same first virtual quadrilateral, and four second subpixels, wherein the four second subpixels are arranged in a same second virtual quadrilateral as one of the two first subpixels, and surround the first subpixel.

In some embodiments of the present disclosure, a line connecting the centers of the second subpixels arranged in the first direction is approximately parallel to the first direction, and a line connecting the centers of the second subpixels arranged in the second direction is approximately parallel to the second direction.

In some embodiments of the present disclosure, two or more of the second subpixels have different shapes and/or areas.

In some embodiments of the present disclosure, a minimum distance between a boundary of the second subpixel and the centers of the first subpixels surrounding the second subpixel is a first distance, a minimum distance between the boundary of the second subpixel and the centers of the third subpixels surrounding the second subpixel is a second distance, and the first distance is not completely equal to the second distance.

In some embodiments of the present disclosure, the four second subpixels in the first virtual quadrilateral are a second subpixel A, a second subpixel B, a second subpixel C and a second subpixel D in a counterclockwise direction, wherein
  the second subpixel A, the second subpixel B, the second subpixel C and the second subpixel D are of a same shape; or
  the second subpixel A and the second subpixel B are of a same shape, the second subpixel C and the second subpixel D are of a same shape, and the second subpixel A and the second subpixel C are of different shapes; or
  the second subpixel A and the second subpixel D are of a same shape, the second subpixel C and the second subpixel B are of a same shape, and the second subpixel A and the second subpixel C are of different shapes; or
  the second subpixel A and the second subpixel C are of a same shape, and the second subpixel A, the second subpixel B and the second subpixel D are of different shapes; or
  the second subpixel A, the second subpixel B, the second subpixel C and the second subpixel D are of different shapes.

In some embodiments of the present disclosure, each of the first subpixels has a same area, and each of the third subpixels has a same area.

In some embodiments of the present disclosure, the area of the first subpixel is S, an area of the second subpixel 02 is f*S, and the area of the third subpixel 03 is g*S, where $0.5 \leq f \leq 0.8$ and $1 \leq g \leq 2.2$.

In some embodiments of the present disclosure, each of the first subpixels is of an approximately same shape; and/or
  each of the third subpixels is of an approximately same shape.

In some embodiments of the present disclosure, a shape of each of the first subpixel, the second subpixel and the third subpixel is any one of a polygon, a circle or an oval.

In some embodiments of the present disclosure, a shape of each of the first subpixel, the second subpixel and the third subpixel is selected from any one of a quadrilateral, a hexagon, an octagon, a quadrilateral with a rounded angle, a hexagon with a rounded angle, an octagon with a rounded angle, a circle and an oval.

In some embodiments of the present disclosure, the first subpixel is a red subpixel, the third subpixel is a blue subpixel and the second subpixel is a green subpixel; or the first subpixel is a blue subpixel, the third subpixel is a red subpixel and the second subpixel is a green subpixel; or the first subpixel is a green subpixel, the third subpixel is a red subpixel and the second subpixel is a blue subpixel; or the first subpixel is a green subpixel, the third subpixel is a blue subpixel and the second subpixel is a red subpixel.

In another aspect, the present disclosure provides in some embodiments an OLED display panel including the above-mentioned display substrate.

In some embodiments of the present disclosure, the OLED display panel further includes a pixel definition layer provided with a plurality of pixel definition layer openings, wherein the first subpixels, the second subpixels and the third subpixels correspond to the pixel definition layer openings respectively, and a shape of each of the first subpixels, the second subpixels and the third subpixels is approximately same to a shape of the respective pixel definition layer opening.

In some embodiments of the present disclosure, the first subpixel includes multiple film layers at least partially covering a region other than the pixel definition layer openings, and/or the second subpixel includes multiple film layers at least partially covering a region other than the pixel definition layer openings, and/or the third subpixel includes multiple film layers at least partially covering a region other than the pixel definition layer openings.

In some embodiments of the present disclosure, at least two of the pixel definition layer openings have different shapes or different areas.

In some embodiments of the present disclosure, at least two of the pixel definition layer openings corresponding to the second subpixels have different shapes or different areas.

In some embodiments of the present disclosure, minimum distances between at least a part of the pixel definition layer openings corresponding to the respective second subpixels and respective adjacent pixel definition layer openings are different.

In yet another aspect, the present disclosure provides in some embodiments a display device including the above-mentioned OLED display panel.

In still yet another aspect, the present disclosure further provides in some embodiments a fine metal mask configured for manufacturing the above-mentioned display substrate, including a plurality of opening regions. The plurality of opening regions includes a first opening region corresponding to a position of the first subpixel, or a second opening region corresponding to a position of the second subpixel, or a third opening region corresponding to a position of the third subpixel.

In some embodiments of the present disclosure, the first subpixel includes multiple film layers, the second subpixel includes multiple film layers, the third subpixel includes multiple film layers, a shape of the first opening region is approximately same to a shape and distribution of at least one of the film layers of the first subpixel, a shape of the third opening region is approximately same to a shape and distribution of at least one of the film layers of the third subpixel, and a shape and distribution of the second opening region are approximately same to a shape and distribution of at least one of the film layers of the second subpixel.

In some embodiments of the present disclosure, at least two of the plurality of second opening regions corresponding to the positions of the second subpixels have different shapes or different areas.

DETAILED DESCRIPTION

Figure 1:
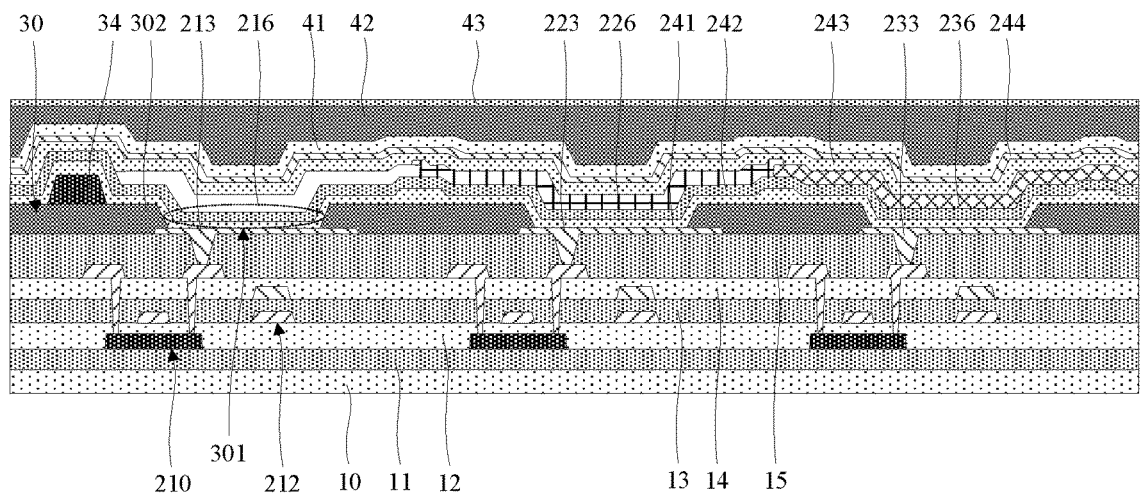
FIG. 1 is a sectional view of a display substrate according to an embodiment of the present disclosure.

In order to make the technical problem to be solved, the technical solutions and the advantages of the present disclosure more apparent, the present disclosure will be described hereinafter in details in conjunction with the drawings and embodiments.

An object of the present disclosure is to provide a display substrate, an OLED display panel, a fine metal mask and a display device, so as to improve the resolution of the display device.

The present disclosure provides in some embodiments a display substrate, including a plurality of first subpixels, a plurality of second subpixels and a plurality of third subpixels, wherein in a first direction, the first subpixels and the third subpixels are arranged alternately to form a plurality of first subpixel rows, and the second subpixels form a plurality of second subpixel rows; the first subpixel rows and the second subpixel rows are arranged alternately in a second direction, lines connecting centers of two first subpixels and two third subpixels in two adjacent rows and two adjacent columns form a first virtual quadrilateral, the two first subpixels are arranged at respective two opposite vertices of the first virtual quadrilateral, the first virtual quadrilateral includes an interior angle a being not equal to 90°, and the second subpixel is arranged within the first virtual quadrilateral;

in the first virtual quadrilateral, a distance between an orthogonal projection of a center of a first subpixel onto a first straight line and an orthogonal projection of a center of a third subpixel onto the first straight line is x, where the first subpixel and the third subpixel are arranged in different first subpixel rows, and the first straight line is parallel to the first direction; a distance between an orthogonal projection of a center of a first subpixel onto a second straight line and an orthogonal projection of a center of a third subpixel onto the second straight line is y, where the first subpixel and the third subpixel are arranged in a same first subpixel row, and the second straight line is parallel to the second direction; the interior angle a of the first virtual quadrilateral is within a range of (h−10°, h+10°, and h is calculated through any one of the following equations:

$$h = 90° - \arctan\left(\frac{x}{P}\right) - \arctan\left(\frac{y}{P}\right);$$

$$h = 90° + \arctan\left(\frac{x}{P}\right) + \arctan\left(\frac{y}{P}\right);$$

$$h = 90 - \left|\arctan\left(\frac{x}{P}\right) - \arctan\left(\frac{y}{P}\right)\right|;$$

$$h = 90° + \left|\arctan\left(\frac{x}{P}\right) - \arctan\left(\frac{y}{P}\right)\right|;$$

where P represents a distance between centers of two second subpixels proximate to each other in the second subpixel row.

The above equations may be approximately equivalent, i.e., there may exist an offset for the interior angle a, e.g., the interior angle a may be fluctuated by 10° or 5° on the basis of h acquired through the calculation.

P may represent an approximate distance between the centers of two adjacent second subpixels. The second subpixels in the second subpixel row may be distributed evenly, i.e., a distance between every two adjacent second subpixels is approximately the same, or there may exist an offset for the distance, e.g., a difference therebetween may be smaller than 5 microns. Here, P may also be an average of the distances between the adjacent second subpixels in the same subpixel row. In addition, P may also be approximately equal to a distance between a center of the first subpixel and a center of an adjacent third subpixel in the same row, e.g., a difference therebetween may be smaller than 5 microns. Alternatively, P may be a half of a distance between centers of two adjacent first subpixels in a same subpixel row, or a half of a distance between centers of two adjacent third subpixels in a same subpixel row.

As compared with a conventional display substrate, in the display substrate according to the embodiments of the present disclosure, the first subpixels, the second subpixels and the third subpixels may be arranged closely in the case of a same process condition, so as to improve the resolution of the display device when a minimum pixel interval has been met. In addition, the second subpixels may be arranged in a staggered manner, so it is able to increase a distance between openings of a fine metal mask for forming the second subpixels in the case of a same aperture ratio, thereby to improve the manufacture allowance for the fine metal mask and improve the resolution. Furthermore, when the first subpixels, the second subpixels and the third subpixels are arranged in a staggered manner, it is able to achieve more even distribution of brightness centers, thereby to improve a display effect of the display device.

In some embodiments of the present disclosure, one first subpixel may include one first active light-emitting region, one second subpixel may include one second active light-emitting region, one third subpixel may include one third active light-emitting region, and an area of the one second active light-emitting region<an area of the one first active light-emitting region<an area of the one third active light-emitting region. On the display substrate, a sum of the areas of all the third active light-emitting regions of the third subpixels>a sum of the areas of all the second active light-emitting regions of the second subpixels>a sum of the areas of all the first active light-emitting regions of the first subpixels. In some embodiments of the present disclosure, the first active light-emitting regions, the second active light-emitting regions and the third active light-emitting regions may be spaced apart from each other. In some embodiments of the present disclosure, the first active light-emitting regions, the second active light-emitting regions and the third active light-emitting regions may be defined by a plurality of openings that are formed in a pixel definition layer and spaced apart from each other. In some embodiments of the present disclosure, each first active light-emitting region may be defined by a light-emitting layer of a corresponding first subpixel, the light-emitting layer of the corresponding first subpixel is arranged between an anode and an opposite cathode in a direction perpendicular to a base substrate and configured to be driven to emit light. In some embodiments of the present disclosure, each second active light-emitting region may be defined by a light-emitting layer of a corresponding second subpixel, the light-emitting layer of the corresponding second subpixel is arranged between an anode and an opposite cathode in the direction perpendicular to the base substrate and configured to be driven to emit light. In some embodiments of the present disclosure, each third active light-emitting region may be defined by a light-emitting layer of a corresponding third subpixel, the light-emitting layer of the corresponding third subpixel is arranged between an anode and an opposite cathode in the direction perpendicular to the base substrate and configured to be driven to emit light. In some embodiments of the present disclosure, each of the first active light-emitting regions, the second active light-emitting regions and the third active light-emitting regions may be defined by a corresponding light-emitting layer and an electrode (anode or cathode) from or to which a carrier (hole or electron) is transmitted to or from the corresponding light-emitting layer or a part of the electrode. In some embodiments of the present disclosure, each of the first active light-emitting regions, the second active light-emitting regions and the third active light-emitting regions may be defined by at least a part of the cathode and at least a part of the anode, an orthogonal projection of the at least a part of the cathode onto the base substrate may overlap an orthogonal projection of the at least a part of the anode onto the base substrate, the orthogonal projection of the at least a part of the cathode onto the base substrate and the orthogonal projection of the at least a part of the anode onto the base substrate may not overlap an orthogonal projection of a first insulation layer onto the base substrate, and the first insulation layer may be arranged between the cathode and the anode in the direction perpendicular to the base substrate. For example, the first insulation layer may include the pixel definition layer. In some embodiments of the present disclosure, each of the first subpixels, the second subpixels and the third subpixels may include a first electrode, a light-emitting layer arranged at a side of the first electrode distal to the base substrate, and a second electrode arranged at a side of the light-emitting layer distal to the first electrode. In the direction perpendicular to the base substrate, a second insulation layer may be further arranged between the first electrode and the light-emitting layer and/or between the second electrode and the light-emitting layer. An orthogonal projection of the second insulation onto the base substrate may overlap an orthogonal projection of the first electrode or the second electrode onto the base substrate, and the second insulation layer may be provided with an opening for exposing at least a part of the first electrode or the second electrode at a side facing the light-emitting layer, so that the first electrode or the second electrode may be in contact with the light-emitting layer or a functional layer configured to assist in the light emission.

Each of the first active light-emitting regions, the second active light-emitting regions and the third active light-emitting regions may be defined by a part of the first electrode or the second electrode in contact with the light-emitting layer or the functional layer configured to assist in the light emission. In some embodiments of the present disclosure, the second insulation layer may include a pixel definition layer. In some embodiments of the present disclosure, the functional layer for assisting in the light emission may be one or more of a hole injection layer, a hole transport layer, an electron transport layer, a hole barrier layer, an electron barrier layer, an electron injection layer, an auxiliary light-emitting layer, an interface improvement layer and an antireflection layer. In some embodiments of the present disclosure, the first electrode may be an anode and the second electrode may be a cathode. In some embodiments of the present disclosure, the first electrode may include at least two layers including an indium tin oxide (ITO) layer, an argentum (Ag) layer that are laminated on each other, e.g., an ITO layer, an Ag layer, and an ITO layer that are laminated on each other. In some embodiments of the present disclosure, the second electrode may be made of one or more of magnesium (Mg), Ag, ITO and indium zinc oxide (IZO), e.g., a mixing layer or an alloy layer of Mg and Ag.

Each subpixel may include a light-emitting layer. Each first subpixel may include a first color light-emitting layer arranged in the corresponding opening and on the pixel definition layer, each second subpixel may include a second color light-emitting layer arranged in the corresponding opening and on the pixel definition layer, and each third subpixel may include a third color light-emitting layer arranged in the corresponding opening and on the pixel definition layer.

In some embodiments of the present disclosure, the display substrate may be manufactured through the following Steps (1) to (9). Here, a flexible display substrate with a top-emission structure in FIG. 1 will be taken as an example.

(1) The base substrate may be formed on a glass support plate.

In some embodiments of the present disclosure, the base substrate 10 may be a flexible base substrate, e.g., it may include a first flexible material layer, a first inorganic material layer, a semiconductor layer, a second flexible material layer and a second inorganic material layer laminated one on another on the glass support plate. The first flexible material layer and the second flexible material layer may be made of polyimide (PI), polyethylene terephthalate (PET) or a polymer soft film acquired after surface treatment. The first inorganic material layer and the second inorganic material may be made of SiNx or SiOx, so as to increase a resistance to moisture and oxygen of the base substrate. The first inorganic material layer and the second inorganic material may also be called as barrier layers. The semiconductor layer may be made of amorphous silicon (a-Si). In some embodiments of the present disclosure, taking a laminated structure PI1/Barrier1/a-Si/PI2/Barrier2 as an example, it may be manufactured as follows. At first, a PI layer may be applied onto the glass support plate, and then cured to form a first flexible layer (PI1). Next, a barrier thin film may be deposited on the first flexible layer to form a first barrier layer (Barrier1) covering the first flexible layer. Next, an a-Si thin film may be deposited on the first barrier layer to form an a-Si layer covering the first barrier layer. Next, another PI layer may be applied onto the a-Si layer and then cured to form a second flexible layer (PI2). Finally, a barrier thin film may be deposited on the second flexible layer to form a second barrier layer (Barrier2) covering the second flexible layer, thereby to acquire the base substrate 10.

(2) A driving structure layer may be formed on the base substrate. The driving structure layer may include a plurality of driving circuitries, and each driving circuitry may include a plurality of transistors and at least one storage capacitor, e.g., it may be of a 2T1C, 3T1C or 7T1C structure.

In some embodiments of the present disclosure, the driving structure layer will be manufactured as follows. The following description will be given by taking a driving circuitry for the first subpixel 01 as an example.

A first insulation thin film and an active layer thin film may be deposited sequentially on the base substrate 10, and the active layer thin film may be patterned through a patterning process, so as to form a first insulation layer 11 covering the entire base substrate 10 and an active layer pattern on the first insulation layer 11. The active layer pattern may at least include a first active layer.

Next, a second insulation thin film and a first metal thin film may be deposited sequentially, and then the first metal thin film may be patterned through a patterning process, so as to form a second insulation layer 12 covering the active layer pattern and a pattern of a first gate metal layer on the second insulation layer 12. The pattern of the first gate metal layer may at least include a first gate electrode and a first capacitive electrode.

Next, a third insulation thin film and a second metal thin film may be deposited sequentially, and the second metal thin film may be patterned through a patterning process, so as to form a third insulation layer 13 covering the first gate metal layer and a pattern of a second gate metal layer on the third insulation layer 13. The pattern of the second gate metal layer may at least include a second capacitive electrode at a position corresponding to a position of the first capacitive electrode.

Next, a fourth insulation thin film may be deposited, and then patterned through a patterning process, so as to form a pattern of a fourth insulation layer 14 covering the second gate metal layer. At least two first via-holes may be formed in the fourth insulation layer 14. The second insulation layer 12, the third insulation layer 13 and the fourth insulation layer 14 in the two first via-holes may be etched off, so as to expose a surface of the first active layer.

Next, a third metal thin film may be deposited, and patterned through a patterning process, so as to form a pattern of a source/drain metal layer on the fourth insulation layer 14. The source/drain metal layer may at least include a first source electrode and a first drain electrode at a display region, and the first source electrode and the first drain electrode may be connected to the first active layer through the first via-holes respectively.

In the driving circuitry for the first subpixel 01 at the display region, the first active layer, the first gate electrode, the first source electrode and the first drain electrode may form a first transistor 210, and the first capacitive electrode and the second capacitive electrode may form a first storage capacitor 212. In the above-mentioned manufacture procedure, a driving circuitry for the second subpixel 02 and a driving circuitry for the third subpixel 03 may be formed simultaneously.

In some embodiments of the present disclosure, each of the first insulation layer 11, the second insulation layer 12, the third insulation layer 13 and the fourth insulation layer 14 may be made of one or more of SiOx, SiNx and SiON, and it may be of a single-layered or multi-layered or composite-layered structure. The first insulation layer 11 may also be called as a buffer layer for improving the resistance to moisture and oxygen of the base substrate. The second insulation layer 12 and the third insulation layer 13 may be called as a gate insulator (GI) layer, and the fourth insulation layer 14 may be called as an interlayer dielectric (ILD) layer. The first metal thin film, the second metal thin film and the third metal thin film may be made of a metal material, e.g., one or more of Ag, copper (Cu), aluminium (Al), titanium (Ti) and molybdenum (Mo), or an alloy thereof, e.g., AlNd or MoNb, and it may be of a single-layered or multi-layered structure, e.g., Ti/Al/Ti. The active layer thin film may be made of one or more of amorphous indium gallium zinc oxide (a-IGZO), zinc oxynitride (ZnON), indium zinc tin oxide (IZTO), a-Si, poly-silicon (p-Si), sexithiophene and polythiophene. In other words, the scheme in the present disclosure may be applied to a transistor manufactured using an oxide-based, silicon-based or organic material-based technology.

(3) A planarization layer may be formed on the base substrate with the above-mentioned patterns.

In some embodiments of the present disclosure, a planarization thin film made of an organic material may be applied onto the base substrate 10 with the above-mentioned patterns, so as to form the planarization (PLN) layer 15 covering the entire base substrate 10. Next, a plurality of second via-holes may be formed in the planarization layer 15 at the display region through masking, exposing and developing processes. The planarization layer 15 in the plurality of second via-holes may be removed through the developing process, so as to expose a surface of the first drain electrode of the first transistor 210 of the driving circuitry for the first subpixel 01, a surface of a first drain electrode of a first transistor of the driving circuitry for the second subpixel 02, and a surface of a first drain electrode of a first transistor of the driving circuitry for the third subpixel 03.

(4) A pattern of the first electrode may be formed on the base substrate with the above-mentioned patterns. In some embodiments of the present disclosure, the first electrode may be a reflective anode.

In some embodiments of the present disclosure, a conductive thin film may be deposited on the base substrate 10 with the above-mentioned patterns, and then patterned through a patterning process, so as to form the pattern of the first electrode. A first anode 213 of the first subpixel 01 may be connected to the first drain electrode of the first transistor 210 through the second via-hole, a second anode 223 of the second subpixel 02 may be connected to the first drain electrode of the first transistor of the second subpixel 02 through the second via-hole, and a third anode 233 of the third subpixel 03 may be connected to the first drain electrode of the first transistor of the third subpixel 03 through the second via-hole.

In some embodiments of the present disclosure, the first electrode may be made of one or more of metal materials, e.g., Mg, Ag, Cu, Al, Ti and Mo, or an alloy thereof, e.g., AlNd or MoNb, and it may be of a single-layered or multi-layered structure, e.g., Ti/Al/Ti. Alternatively, the first electrode may be of a stacked structure made of a metal material and a transparent conductive material, e.g., a reflective material such as ITO/Ag/ITO or Mo/AlNd/ITO.

(5) A pattern of the pixel definition layer (PDL) may be formed on the base substrate with the above-mentioned patterns.

In some embodiments of the present disclosure, a pixel definition thin film may be applied onto the base substrate 10 with the above-mentioned patterns, so as to form the pattern of the pixel definition layer through masking, exposing and developing processes. The pixel definition layer 30 at the display region may include a plurality of subpixel definition members 302, and a plurality of pixel definition layer openings 301 may be formed between the adjacent subpixel definition members 302. The pixel definition layer 30 in the plurality of pixel definition layer openings 301 may be removed through the developing process, so as to expose at least a part of a surface of the first anode 213 of the first subpixel 01, at least a part of a surface of the second anode 223 of the second subpixel 02, and at least a part of a surface of the third anode 233 of the third subpixel 03.

In some embodiments of the present disclosure, the pixel definition layer 30 may be made of PI, polymethyl methacrylate or PET.

(6) A pattern of a post spacer (PS) may be formed on the base substrate with the above-mentioned patterns.

In some embodiments of the present disclosure, an organic material thin film may be applied onto the base substrate 10 with the above-mentioned patterns, so as to form the pattern of the post spacer 34 through masking, exposing and developing processes. The post spacer 34 may serve as a support layer configured to support a fine metal mask (FMM) during the evaporation process. In some embodiments of the present disclosure, one repetition unit may be arranged between two adjacent post spacers 34 in a row direction of the subpixels. For example, the post spacer 34 may be arranged between the first subpixel 01 and the adjacent third subpixel 03.

(7) Organic functional layers and the second electrode may be formed sequentially on the base substrate with the above-mentioned patterns. In some embodiments of the present disclosure, the second electrode may be a transparent cathode. Light emitted by a light-emitting element may pass through the transparent cathode and exit from a side distal to the base substrate 10, so as to achieve top-emission. In some embodiments of the present disclosure, the organic functional layers of the light-emitting element may include a hole injection layer, a hole transport layer, a light-emitting layer and an electron transport layer.

In some embodiments of the present disclosure, the hole injection layer 241 and the hole transport layer 242 may be formed sequentially through evaporation on the base substrate 10 with the above-mentioned patterns using an open mask, a blue light-emitting layer 236, a green light-emitting layer 216, and a red light-emitting layer 226 may be formed sequentially through evaporation using the FMM, and then the electron transport layer 243, the cathode 244 and an optical coupling layer may be formed sequentially through evaporation using the open mask. The hole injection layer 241, the hole transport layer 242, the electron transport layer 243 and the cathode 244 may each be a common layer for a plurality of subpixels. In some embodiments of the present disclosure, the organic functional layers may further include a microcavity regulating layer arranged between the hole transport layer and the light-emitting layer. For example, a blue microcavity regulating layer, a blue light-emitting layer, a green microcavity regulating layer, a green light-emitting layer, a red microcavity regulating layer and a red light-emitting layer may be formed sequentially through evaporation using the FMM, after the formation of the hole transport layer.

In some embodiments of the present disclosure, the organic functional layers may be formed at a subpixel region, so as to be connected to the anode. The cathode may be formed on the pixel definition layer and connected to the organic functional layers.

In some embodiments of the present disclosure, the cathode may be made of one or more of Mg, Ag and Al or an alloy thereof, or made of a transparent conductive material, e.g., ITO, or it may be of a multi-layered structure made of metal and a transparent conductive material.

In some embodiments of the present disclosure, the optical coupling layer may be formed at a side of the cathode 244 distal to the base substrate 10, and the optical coupling layer may serve as a common layer for a plurality of subpixels. The optical coupling layer may cooperate with the transparent cathode to increase a light output. For example, the optical coupling layer may be made of a semiconductor material, but a material of the optical coupling layer will not be further particularly defined herein.

(8) An encapsulation layer may be formed on the base substrate with the above-mentioned patterns.

In some embodiments of the present disclosure, the encapsulation layer may be formed on the base substrate 10 with the above-mentioned patterns, and the encapsulation layer may include a first encapsulation layer 41, a second encapsulation layer 42 and a third encapsulation layer 43 laminated one on another. The first encapsulation layer 41 may be made of an inorganic material and cover the cathode 244 at the display region. The second encapsulation layer 42 may be made of an organic material. The third encapsulation layer 43 may be made of an inorganic material and cover the first encapsulation layer 41 and the second encapsulation layer 42. However, a structure of the encapsulation layer will not be further particularly defined herein. In some embodiments of the present disclosure, the encapsulation layer may be of a five-layered structure consisting of an inorganic layer, an organic layer, an inorganic layer, an organic layer and an inorganic layer.

In some embodiments of the present disclosure, x may be within a range of 1 μm to 10 μm, and y may be within a range of 1 μm to 10 μm. Further, x may be within a range of 2 μm to 7 μm, and y may be within a range of 2 μm to 7 μm; or x may be within a range of 2 μm to 8 μm, and y may be within a range of 2 μm to 8 μm.

In some embodiments of the present disclosure, the interior angle a may be greater than or equal to 70° and smaller than 90°. Further, the interior angle a may be greater than or equal to 75° and not equal to 90°.

In some embodiments of the present disclosure, a line connecting centers of the first subpixel and the third subpixel adjacent to each other in the first direction may be parallel to the first direction, and a line connecting centers of the first subpixel and the third subpixel adjacent to each other in the second direction may be parallel to the second direction; or the line connecting the centers of the first subpixel and the third subpixel adjacent to each other in the first direction may be parallel to the first direction, the line connecting the centers of the first subpixel and the third subpixel adjacent to each other in the second direction may be angled relative to the second direction at an angle c, and the angle c may be greater than 0° and not equal to 90°; or the line connecting the centers of the first subpixel and the third subpixel adjacent to each other in the first direction may be angled relative to the first direction at an angle d, the line connecting the centers of the first subpixel and the third subpixel adjacent to each other in the second direction may be angled relative to the second direction at an angle e, the angle d may be greater than 0° and not equal to 90°, and the angle e may be greater than 0° and not equal to 90°.

Further, the angle c may be within a range of 0° to 30°, or 0° to 20°, or 0° to 10°, or 0° to 5°, e.g., 1°, 2°, 3° or 4°.

In some embodiments of the present disclosure, the first direction may be approximately perpendicular to the second direction, the first direction may be one of a row direction and a column direction, and the second direction may be the other one of the row direction and the column direction.

In some embodiments of the present disclosure, a shape of the second subpixel may be selected from any one of a polygon, an axisymmetric pattern and a centrosymmetric pattern, e.g., an irregular polygon, such as a rectangle with one or three corners being cut off, a rectangle with two adjacent corners being cut off or a rectangle with two opposite corners being cut off. The shape of the second subpixel may be provided with a length direction, the length direction of the second subpixel may be an extension direction of a longest side of the polygon, an extension direction of a long axis of the axisymmetric pattern or a direction of a line connecting two end points of a group of opposite and parallel sides of the centrosymmetric pattern, the two end points are at a same side of a symmetric center, and the length direction of the second subpixel may cross the first direction and the second direction; and wherein X=0, a size L' of the second subpixel in the length direction may approximately satisfy L'=(L+y/√2)±5 μm and a size M' of the second subpixel in a width direction may approximately satisfy M'=(M−y/√2)±5 μm, or a size L' of the second subpixel in its width direction may approximately satisfy L'=(L−y/√2)±5 μm and a size M' of the second subpixel in its length direction may approximately satisfy M'=(M+y/√2)±5 μm; or wherein y=0, the size L' of the second subpixel in its length direction may approximately satisfy L'=(L+x/√2)±5 μm and the size M' of the second subpixel in its width direction may approximately satisfy M'=(M−x/√2)±5 μm, or the size L' of the second subpixel in its width direction may approximately satisfy L'=(L−x/√2)±5 μm and the size M' of the second subpixel in its length direction may approximately satisfy M'=(M+x/√2)±5 μm, wherein the width direction and the length direction of the same second subpixel may be approximately perpendicular to each other, and each of L and M may have a preset value. L may be within a range of 10 μm to 50 μm, and M may be within a range of 5 μm to 40 μm. For example, each of L and M may be within a range of 8 μm to 3 μm.

In some embodiments of the present disclosure, a shape of the second subpixel may be provided with a length direction, the second subpixel may have a maximum size in its length direction, the length direction of the second subpixel may cross the first direction and the second direction, x may be greater than 0 and y may be greater than 0, a size L' of the second subpixel in its length direction may approximately satisfy $$L' = \left(L + \frac{x}{\sqrt{2}} - \frac{y}{\sqrt{2}}\right) \pm 5 \text{ μm}$$

and a size M' of the second subpixel in its width direction may approximately satisfy $$M' = \left(M - \frac{x}{\sqrt{2}} + \frac{y}{\sqrt{2}}\right) \pm 5 \text{ μm;}$$

or
the size L' of the second subpixel in its length direction may approximately satisfy $$L' = \left(L + \frac{x}{\sqrt{2}} + \frac{y}{\sqrt{2}}\right) \pm 5 \text{ μm}$$

and the size M' of the second subpixel in its width direction may approximately satisfy $$M' = \left(M - \frac{x}{\sqrt{2}} - \frac{y}{\sqrt{2}}\right) \pm 5 \text{ μm;}$$

or
the size L' of the second subpixel in its length direction may approximately satisfy $$L' = \left(L - \frac{x}{\sqrt{2}} - \frac{y}{\sqrt{2}}\right) \pm 5 \text{ μm}$$

and the size M' of the second subpixel in its width direction may approximately satisfy $$M' = \left(M + \frac{x}{\sqrt{2}} + \frac{y}{\sqrt{2}}\right) \pm 5 \text{ μm;}$$

or
the size L' of the second subpixel in its length direction may approximately satisfy $$L' = \left(L - \frac{x}{\sqrt{2}} + \frac{y}{\sqrt{2}}\right) \pm 5 \text{ μm and}$$

the size M' of the second subpixel in its width direction may approximately satisfy $$M' = \left(M + \frac{x}{\sqrt{2}} - \frac{y}{\sqrt{2}}\right) \pm 5 \text{ μm,}$$

where each of L and M may have a preset value. L may be within a range of 10 μm to 50 μm, and M may be within a range of 5 μm to 40 μm. For example, each of L and M may be within a range of 8 μm to 30 μm.

In some embodiments of the present disclosure, sides of four first virtual quadrilaterals arranged in two columns and two rows are shared to form a second virtual polygon, the second virtual polygon may be a quadrilateral or an octagon, and the second virtual polygon includes four second subpixels, five first subpixels and four third subpixels;

the four second subpixels are arranged in the four first virtual quadrilaterals respectively, one of the first subpixels is surrounded by the four second subpixels, the other four first subpixels and the four third subpixels are arranged alternately and respectively at sides or vertices of the second virtual polygon in a clockwise or counterclockwise direction of sides of the second virtual polygon; and lines connecting centers of the four first subpixels at the sides or vertices of the second virtual polygon approximately form a virtual parallelogram, and/or lines connecting centers of the four third subpixels at the sides or vertices of the second virtual polygon approximately form a virtual parallelogram, and/or lines connecting centers of the four second subpixels in the four first virtual quadrilaterals approximately form a virtual parallelogram.

In some embodiments of the present disclosure, the second virtual polygon may be a reentrant hexagon, two of the third subpixels may be arranged at two sides of the reentrant hexagon respectively, and the other two third subpixels and the four first subpixels may be arranged at six vertices of the reentrant hexagon respectively; or the second virtual polygon may be a reentrant octagon, and the four first subpixels and the four third subpixels may be arranged at eight vertices of the reentrant octagon respectively.

When x=0 or y=0, the lines connecting the centers of the four first subpixels at the sides or vertices of the second virtual polygon may be approximately a virtual rectangle, the lines connecting the centers of the four third subpixels at the sides or vertices of the second virtual polygon may be approximately a virtual rectangle, and the lines connecting the centers of the four second subpixels in the four first virtual quadrilaterals may be approximately a virtual rectangle.

In some embodiments of the present disclosure, a line connecting the centers of at least a part of the first subpixels may be approximately arranged on a third straight line, a line connecting the centers of at least a part of the first subpixels may be approximately arranged on a fourth straight line, and the third straight line may be approximately parallel to the fourth straight line.

In some embodiments of the present disclosure, the third straight line may not coincide with the fourth straight line, and both the third straight line and the fourth straight line may be approximately parallel to the first direction; or the third straight line may not coincide with the fourth straight line, and both the third straight line and the fourth straight line may be approximately parallel to the second direction.

In some embodiments of the present disclosure, a line connecting the centers of at least a part of the second subpixels in a same second pixel row may be approximately arranged on a fifth straight line, and the fifth straight line may be approximately parallel to the third straight line and the fourth straight line.

The second virtual polygon may be a reentrant polygon or a convex polygon. Sides of the first virtual quadrilaterals may be shared to form the second virtual polygon, i.e., two first virtual quadrilaterals adjacent to each other in a row direction may share a side in a column direction, and two first virtual quadrilaterals adjacent to each other in the column direction may share a side in the row direction.

In some embodiments of the present disclosure, the four first virtual quadrilaterals in a same second virtual polygon may include a first one and a second one, an absolute value of a difference between a minimum interior angle of the first one and 90° may be smaller than an absolute value of a difference between a minimum interior angle of the second one and 90°, and a width-to-length ratio of the second subpixel in the first one may be greater than a width-to-length ratio of the second subpixel in the second one.

A length of the second subpixel may be a maximum size of the second subpixel in its length direction, and a width of the second subpixel may be a maximum size of the second subpixel in its width direction.

Alternatively, the second subpixel may include two symmetry axes perpendicular to each other, and the width-to-length ratio of the second subpixel may be just a ratio of a size of a shorter one of the two symmetry axes to a size of a longer one of the two symmetry axes.

In some embodiments of the present disclosure, the display substrate may include a plurality of pixel repetition units, the pixel repetition unit may include two first subpixels and two third subpixels in a same first virtual quadrilateral, and four second subpixels arranged in a same second virtual quadrilateral as one of the two first subpixels and surrounding the first subpixel.

In addition, a pixel repetition unit at a periphery of the display substrate may have a structure different from a pixel repetition unit inside the display substrate, and a part of the subpixels may not be included in the pixel repetition unit at the periphery of the display substrate.

In some embodiments of the present disclosure, a line connecting the centers of the second subpixels in the first direction may be approximately parallel to the first direction, and a line connecting the centers of the second subpixels in the second direction may be approximately parallel to the second direction.

In some embodiments of the present disclosure, a part of the second subpixels may have different shapes and/or areas. For example, some second subpixels may have a shape or an area different from the others, or some second subpixels may have a shape and an area different from the others.

In some embodiments of the present disclosure, a minimum distance between a boundary of the second subpixel and the centers of the first subpixels surrounding the second subpixel may be a first distance, a minimum distance between the boundary of the second subpixel and the centers of the third subpixels surrounding the second subpixel may be a second distance, and the first distance may be not equal to the second distance.

In some embodiments of the present disclosure, the four second subpixels in the first virtual quadrilateral may include a second subpixel A, a second subpixel B, a second subpixel C and a second subpixel D in a counterclockwise direction, the second subpixel A, the second subpixel B, the second subpixel C and the second subpixel D may be of a same shape; or the second subpixel A and the second subpixel B may be of a same shape, the second subpixel C and the second subpixel D may be of a same shape, and the second subpixel A and the second subpixel C may be of different shapes; or the second subpixel A and the second subpixel D may be of a same shape, the second subpixel C and the second subpixel B may be of a same shape, and the second subpixel A and the second subpixel C may be of different shapes; or the second subpixel A and the second subpixel C may be of a same shape, and the second subpixel A, the second subpixel B and the second subpixel D may be of different shapes; or the second subpixel A, the second subpixel B, the second subpixel C and the second subpixel D may be of different shapes.

In a possible embodiment of the present disclosure, in the display substrate, the first subpixel may be a red subpixel, the third subpixel may be a blue subpixel and the second subpixel may be a green subpixel; or the first subpixel may be a blue subpixel, the third subpixel may be a red subpixel and the second subpixel may be a green subpixel. In this regard, the green subpixel in the first virtual quadrilateral may form a light-emitting pixel point together with the red subpixel and the blue subpixel at any two adjacent corners of the first virtual quadrilateral.

In some embodiments of the present disclosure, alternatively, the first subpixel may be a green subpixel, the third subpixel may be a red subpixel and the second subpixel may be a blue subpixel; or the first subpixel may be a green subpixel, the third subpixel may be a blue subpixel and the second subpixel may be a red subpixel.

In a possible embodiment of the present disclosure, in the display substrate, each of the first subpixels may have a same area, so as to ensure that a first subpixel in any light-emitting pixel point consisting of the first subpixel, a second subpixel and a third subpixel has a same light-emission area.

It should be noted that, during the implementation, in the display substrate according to the embodiments of the present disclosure, at least two first subpixels may have different areas, which will not be further particularly defined herein.

In a possible embodiment of the present disclosure, in the display substrate, each of the second subpixels may have a same area, so as to ensure that a second subpixel in any light-emitting pixel point consisting of a first subpixel, the second subpixel and a third subpixel has a same light-emission area.

It should be noted that, during the implementation, in the display substrate according to the embodiments of the present disclosure, at least two second subpixels may alternatively have different areas, which will not be further particularly defined herein.

In a possible embodiment of the present disclosure, in the display substrate, each of the third subpixels may have a same area, so as to ensure that a third subpixel in any light-emitting pixel point consisting of a first subpixel, a second subpixel and the third subpixel has a same light-emission area.

It should be noted that, during the implementation, in the display substrate according to the embodiments of the present disclosure, at least two third subpixels may alternatively have different areas, which will not be further particularly defined herein.

In some embodiments of the present disclosure, the area of the first subpixel may be S, an area of the second subpixel 02 may be f*S, and the area of the third subpixel 03 may be g*S, where $0.5 \leq f \leq 0.8$ and $1 \leq g \leq 2.2$. In this way, the brightness center of any light-emitting pixel point consisting of the first subpixel, the second subpixel and the third subpixel may be distributed more evenly, so it is able to improve the display effect.

Further, the blue subpixel has relatively low luminous efficiency and a relatively short service life. In a possible embodiment of the present disclosure, in the display substrate, an area of the blue subpixel may be designed to be greater than those of the red subpixel and the green subpixel.

Further, in the display substrate according to the embodiments of the present disclosure, usually the green subpixel has relatively high luminous efficiency, so the area of the green subpixel may be arranged to be smaller than that of the red subpixel. It should be noted that, during the implementation, the area of the green subpixel may alternatively be the same as that of the red subpixel, which will not be further particularly defined herein.

In order to provide a same mask pattern for pixels of a same type during the manufacture and thereby to simplify a patterning process, in a possible embodiment of the present disclosure, in the display substrate, each of the first subpixels may be of an approximately same shape.

It should be noted that, during the implementation, in the display substrate according to the embodiments of the present disclosure, at least two first subpixels may have different shapes, which will not be further particularly defined herein.

In order to provide a same mask pattern for pixels of a same type during the manufacture and thereby to simplify a patterning process, in a possible embodiment of the present disclosure, in the display substrate, each of the second subpixels may be of an approximately same shape.

It should be noted that, during the implementation, in the display substrate according to the embodiments of the present disclosure, at least two second subpixels may have different shapes, which will not be further particularly defined herein.

In addition, in a possible embodiment of the present disclosure, in the display substrate, when the four second subpixels have a same or similar pattern in one second virtual parallelogram, the second subpixels may be arranged at a same angle or at any different angles, which will not be further particularly defined herein.

In order to provide a same mask pattern for pixels of a same type during the manufacture and thereby to simplify a patterning process, in a possible embodiment of the present disclosure, in the display substrate, the third subpixels may be of an approximately same shape.

It should be noted that, during the implementation, in the display substrate according to the embodiments of the present disclosure, at least two third subpixels may have different shapes, which will not be further particularly defined herein.

In a possible embodiment of the present disclosure, the shapes, the positions, the parallel relationship and the angular relationship of the second subpixels, the first subpixels and the third subpixels may be set according to the practical need. In an actual process, due to the limitations of a process condition or any other factors, there may exist an offset. Hence, the shapes, the positions and the relative position relationship of the subpixels merely need to approximately satisfy the above-mentioned conditions, which also fall within the scope of the present disclosure.

It should be appreciated that, in the embodiments of the present disclosure, when the subpixels have different patterns, it means that the shapes of the subpixels are different from each other, e.g., one subpixel is of a circular shape and the other is of a rectangular shape. In contrast, when the subpixels have the same pattern, it means that the shapes of the subpixels are similar or the same. For example, when two subpixels are of a triangular shape, they may be considered to have the same shape, regardless of their areas.

In some embodiments of the present disclosure, the shape of each of the first subpixel, the second subpixel and the third subpixel may be any one of a polygon, a circle or an oval.

In some embodiments of the present disclosure, the shape of each of the first subpixel, the second subpixel and the third subpixel may be selected from any one of a quadrilateral, a hexagon, an octagon, a quadrilateral with a rounded angle, a hexagon with a rounded angle, an octagon with a rounded angle, a circle and an oval.

It should be appreciated that, in the display substrate according to the embodiments of the present disclosure, when a subpixel is arranged at a certain position, it means that the subpixel is arranged within a certain position range as long as the subpixel overlaps the position. During the implementation, a center of the subpixel may overlap the position. Alternatively, the center of the subpixel may not overlap the position, i.e., there may exist an offset therebetween, which will not be further particularly defined herein. In addition, the center of the subpixel may be a geometrical center of the pattern of the subpixel, or a luminescent center of the subpixel, which will not be further particularly defined herein.

In a possible embodiment of the present disclosure, in the display substrate, the center of each subpixel may be close to a corresponding position as possible, so as to distribute the subpixels evenly.

The following description will be given in conjunction with the drawings and the specific embodiments.

First Embodiment

Figure 2:
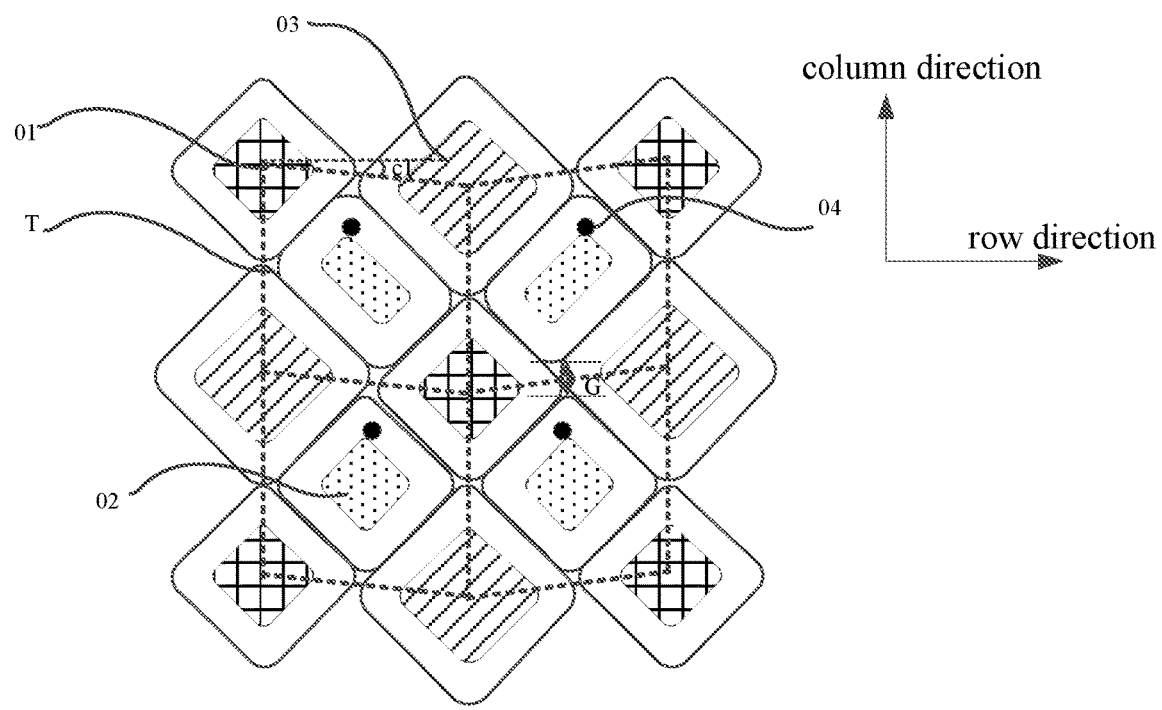
FIGS. 2 to 13 are schematic views showing the display substrate according to embodiments of the present disclosure.

In this embodiment, as shown in FIG. 2, first subpixels 01 and third subpixels 03 may be arranged alternately to form a plurality of first subpixel rows, second subpixels 02 may form a plurality of second subpixel rows, and the first subpixel rows and the second subpixel rows may be arranged alternately in a column direction. Lines connecting centers of two first subpixels 01 and two third subpixels 03 in two adjacent rows and two adjacent columns may form a first virtual quadrilateral T (a small dotted box in FIG. 2). The two first subpixels 01 may be arranged at two opposite vertices of the first virtual quadrilateral T, the two third subpixels 03 may be arranged at the other two opposite vertices of the first virtual quadrilateral T, and one second subpixel 02 may be arranged within the first virtual quadrilateral T. A center of the second subpixel 02 may, or may not, coincide with a center of the first virtual quadrilateral T.

As shown in FIG. 2, in the first virtual quadrilateral T, a line connecting the centers of the first subpixel 01 and the third subpixel 03 adjacent to each other in the column direction may be parallel to the column direction. A line connecting the centers of the first subpixel 01 and the third subpixel 03 adjacent to each other in a row direction may not be parallel to the row direction, and there may exist an angle c1 therebetween, where c1 is greater than 0° and smaller than 90°. In other words, two sides of the first virtual quadrilateral T may be parallel to the column direction, and the other two sides of the first virtual quadrilateral T may be angled relative to the row direction at the angle c1. To be specific, c1 may be within a range of 0°-30°, 0°-20°, 0°-10° or 0°-5°, e.g., 1°, 2°, 3° or 4°.

Four adjacent first virtual quadrilaterals T may be arranged in two columns and two rows to form a large virtual polygon (i.e., a largest dotted box in FIG. 2), i.e., the second virtual polygon. The first subpixels 01 may be arranged at a center of the second virtual polygon and four vertices of the second virtual polygon, and the third subpixels 03 may be arranged at midpoints of sides of the second virtual polygon. Lines connecting the centers of the second subpixels 02 in the second virtual polygon may form a virtual rectangle.

In the above-mentioned pixel arrangement mode, brightness centers 04 of the light-emitting pixel points formed by the first subpixels 01, the second subpixels 02 and the third subpixels 03 may be distributed more evenly, so it is able to improve the display effect of the display device.

In addition, as shown in FIG. 2, the second subpixels 02 may be arranged in a staggered manner, so as to increase the manufacture allowance of the metal mask. In this regard, it is able to increase a distance G between openings of the mask for forming the second subpixels 02 (corresponding to a smallest solid box surrounding the second subpixel 02) in the case of a same aperture ratio, thereby to increase the manufacture allowance of the metal mask and provide a higher resolution.

In this embodiment, a distance between orthogonal projections of a center of the first subpixel 01 and a center of the third subpixel 03 in a same first subpixel row onto a second straight line may be y, the second straight line may be parallel to the column direction, and y may be within a range of 1 μm to 10 μm or 2 μm to 10 μm.

An interior angle a of the first virtual quadrilateral T smaller than 90° may meet the following equation:

$$a = 90° - \arctan\left(\frac{y}{P}\right);$$

for example, when P=57.9 μm and y=5 μm, at this time the acute angle a=85.06°.

Figure 3:
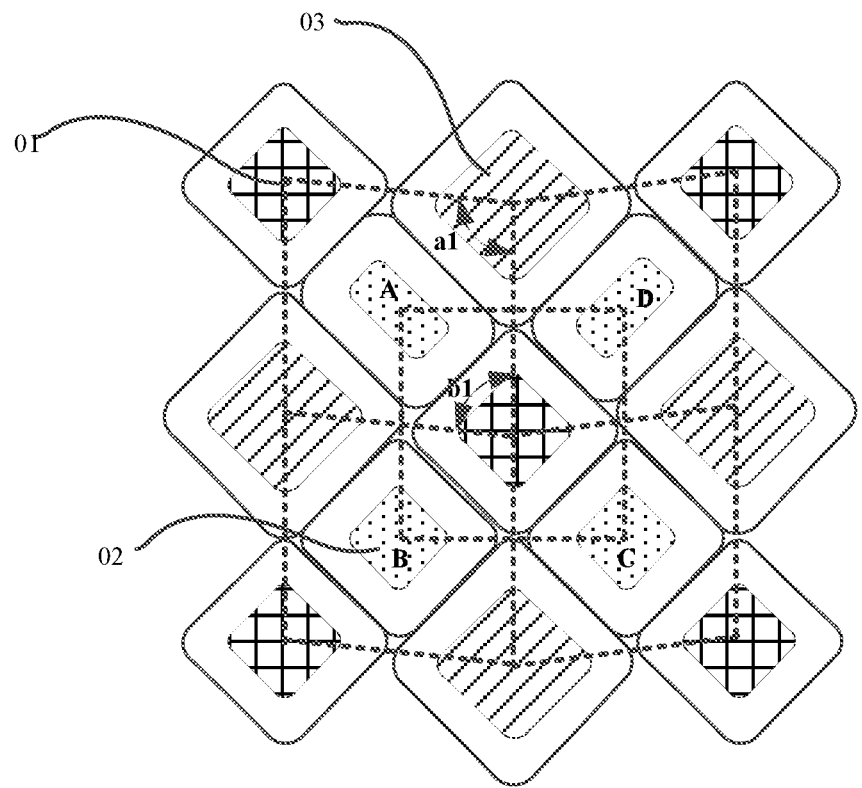

As shown in FIG. 3, in a specific embodiment of the present disclosure, an obtuse angle a1 of the first virtual quadrilateral T may be 95°, and an acute angle b1 may be 85°.

In addition, a shape of the second subpixel 02 in this embodiment may have a length direction, the second subpixel 02 may have a maximum size in its length direction, and the length direction of the second subpixel 02 may cross the row direction and the column direction.

For a second subpixel A and a second subpixel C, a size L' of the second subpixel 02 in its length direction may approximately meet L'=L+y/√2, and a size M' of the second subpixel in its width direction may approximately meet M'=M−y/√2;

for example, P=57.9 μm, a gap of a pixel definition layer of the display substrate=19 mm, L=22.08 μm, M=15.63 μm and y=5 μm, at this time L'=18.55 μm and M'=19.17 μm.

For a second subpixel B and a second subpixel D, a size L' of the second subpixel 02 in its width direction may approximately meet L'=L−y/√2, and a size M' of the second subpixel in its length direction may approximately meet M'=M+y/√2;

for example, P=57.9 μm, the gap of the pixel definition layer of the display substrate=19 mm, L=22.08 μm, M=15.63 μm and y=5 μm, at this time L'=25.62 μm and M'=12.10 μm.

Figure 4:
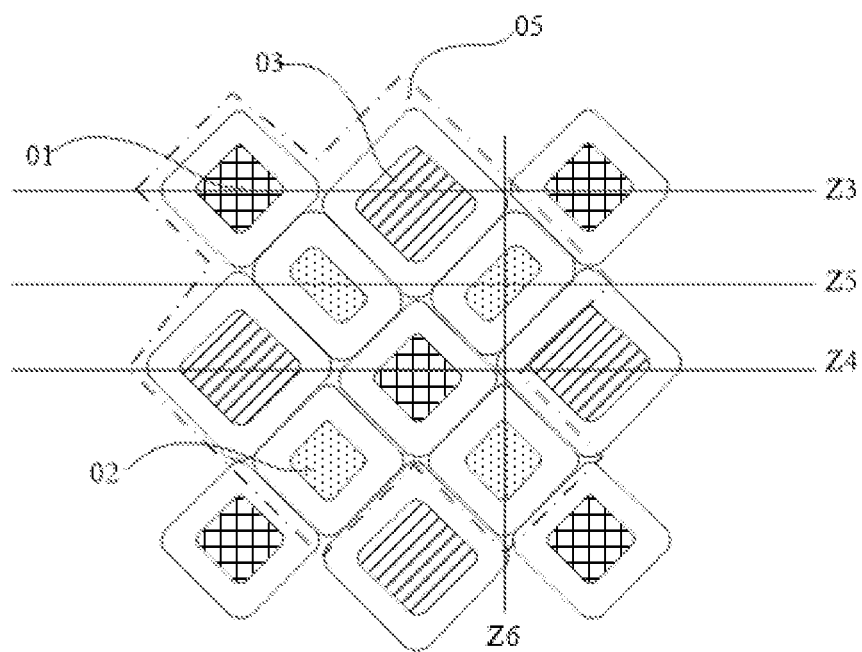

As shown in FIG. 4, in this embodiment, one pixel repetition unit 05 (a portion surrounded by a dotted box in FIG. 4) may include two third subpixels 03, two first subpixels 01 and four second subpixels 02.

As shown in FIG. 4, a line connecting the centers of at least a part of the first subpixels 01 may be approximately arranged on a third straight line Z3, a line connecting the centers of at least a part of the third subpixels 03 may be approximately arranged on a fourth straight line Z4, and the third straight line may be approximately parallel to the fourth straight line.

A line Z5 connecting the centers of the second subpixels 02 in the first direction (e.g., the row direction) may be approximately parallel to the first direction, and a line Z6 connecting the centers of the second subpixels 02 in the second direction (e.g., the column direction) may be approximately parallel to the second direction.

Figure 5:
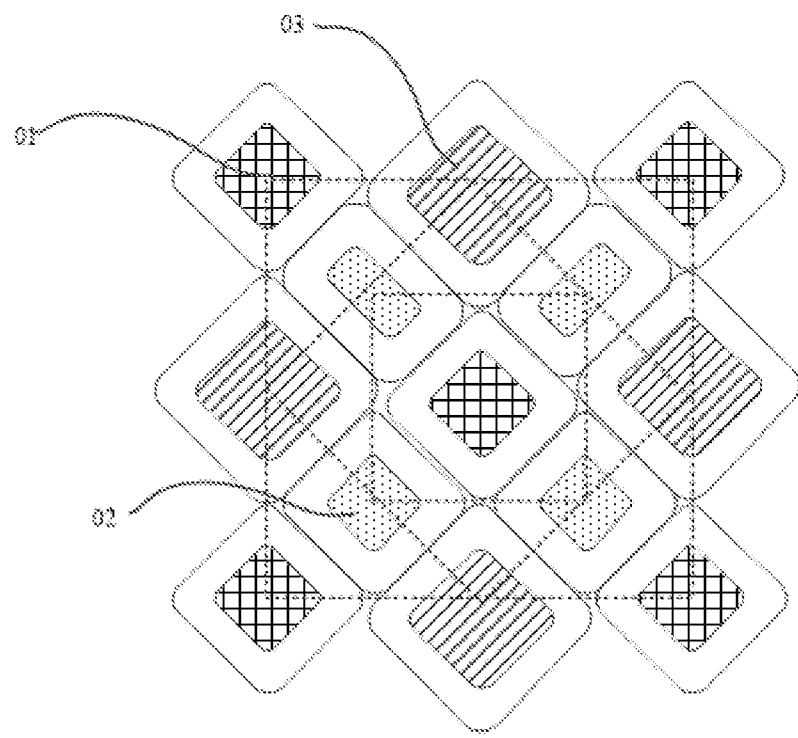

As shown in FIG. 5, in this embodiment, lines connecting the centers of the four first subpixels 01 at the sides or vertices of the second virtual polygon may be approximately a virtual rectangle, lines connecting the centers of the four third subpixels 03 at the sides or vertices of the second virtual polygon may be approximately a virtual rectangle, and lines connecting the centers of the four second subpixels 02 in the four first virtual quadrilaterals may be approximately a virtual rectangle.

Second Embodiment

Figure 6:
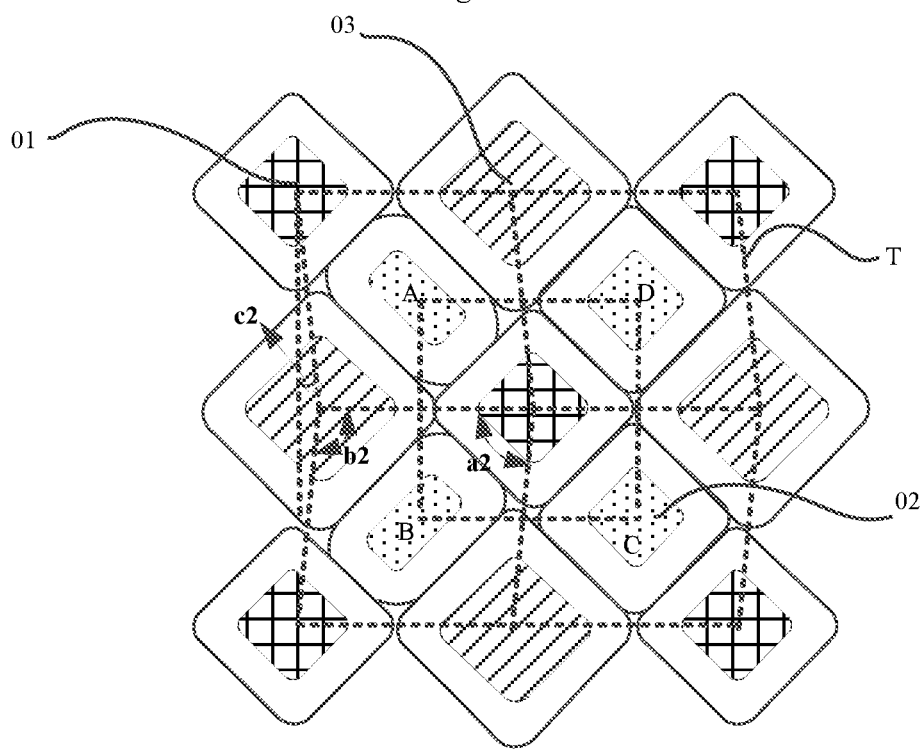

In this embodiment, as shown in FIG. 6, the first subpixels 01 and the third subpixels 03 may be arranged alternately to form a plurality of first subpixel rows, the second subpixels 02 may form a plurality of second subpixel rows, and the first subpixel rows and the second subpixel rows may be arranged alternately in the column direction. Lines connecting centers of two first subpixels 01 and two third subpixels 03 in two adjacent rows and two adjacent columns may form a first virtual quadrilateral T (a small dotted box in FIG. 6). The two first subpixels 01 may be arranged at two opposite vertices of the first virtual quadrilateral T, the two third subpixels 03 may be arranged at the other two opposite vertices of the first virtual quadrilateral T, and one second subpixel 02 may be arranged within the first virtual quadrilateral T. A center of the second subpixel 02 may, or may not, coincide with a center of the first virtual quadrilateral T.

As shown in FIG. 6, in the first virtual quadrilateral T, a line connecting the centers of the first subpixel 01 and the third subpixel 03 adjacent to each other in the column direction may not be parallel to the column direction, and there may exist an angle c2 therebetween, where c2 is greater than 0° and smaller than 90°. A line connecting the centers of the first subpixel 01 and the third subpixel 03 adjacent to each other in the row direction may be parallel to the row direction. In other words, two sides of the first virtual quadrilateral T may be parallel to the row direction, and the other two sides of the first virtual quadrilateral T may be angled relative to the column direction at the angle c2. To be specific, c2 may be within a range of 0°-30°, 0°-20°, 0°-10° or 0°-5°, e.g., 1°, 2°, 3° or 4°.

Four adjacent first virtual quadrilaterals T may be arranged in two columns and two rows to form a large virtual polygon (i.e., a largest dotted box in FIG. 6), i.e., the second virtual polygon. The first subpixels 01 may be arranged at a center and four vertices of the second virtual polygon, and the third subpixels 03 may be arranged at midpoints of sides of the second virtual polygon. Lines connecting the centers of the second subpixels 02 in the second virtual polygon may form a virtual rectangle.

In the above-mentioned pixel arrangement mode, brightness centers of the light-emitting pixel points formed by the first subpixels 01, the second subpixels 02 and the third subpixels 03 may be distributed more evenly, so it is able to improve the display effect of the display device.

In addition, as shown in FIG. 6, the second subpixels 02 may be arranged in a staggered manner, so as to increase the manufacture allowance of the metal mask. In this regard, it is able to increase a distance between openings of the mask for forming the second subpixels 02 in the case of a same aperture ratio, thereby to increase the manufacture allowance of the metal mask and provide a higher resolution.

In this embodiment, a distance between orthogonal projections of the centers of the first subpixel 01 and the third subpixel 03 in different first subpixel rows onto a first straight line may be x, the first straight line may be parallel to the row direction, and x may be within a range of 1 μm to 10 μm or 2 μm to 10 μm.

An interior angle a of the first virtual quadrilateral T smaller than 90° may meet the following equation:

$$a = 90° - \arctan\left(\frac{x}{P}\right);$$

for example, when P=57.9 μm and x=5 μm, at this time the acute angle a=85.06°.

As shown in FIG. 6, in a specific embodiment of the present disclosure, an acute angle a2 of the first virtual quadrilateral T may be 85°, and an obtuse angle b2 may be 95°.

In addition, a shape of each second subpixel 02 in this embodiment may have a length direction, the second subpixel 02 may have a maximum size in the length direction, and the length direction of the second subpixel 02 may cross the row direction and the column direction.

For a second subpixel A and a second subpixel B, a size L' of the second subpixel 02 in its length direction may approximately meet L'=L+x/√2, and a size M' of the second subpixel in its width direction may approximately meet M'=M−x/√2;

for example, P=57.9 μm, the gap of the pixel definition layer of the display substrate=19 mm, L=22.08 μm, M=15.63 μm and x=5 μm, at this time L'=25.62 μm and M'=12.10 μm.

For a second subpixel C and a second subpixel D, a size L' of the second subpixel 02 in its width direction may approximately meet L'=L−x/√2, and a size M' of the second subpixel in its length direction may approximately meet M'=M'=M+x/√2;

for example, P=57.9 μm, the gap of the pixel definition layer of the display substrate=19 mm, L=22.08 μm, M=15.63 μm and y=5 μm, at this time L'=18.55 μm and M'=19.17 μm.

Figure 7:
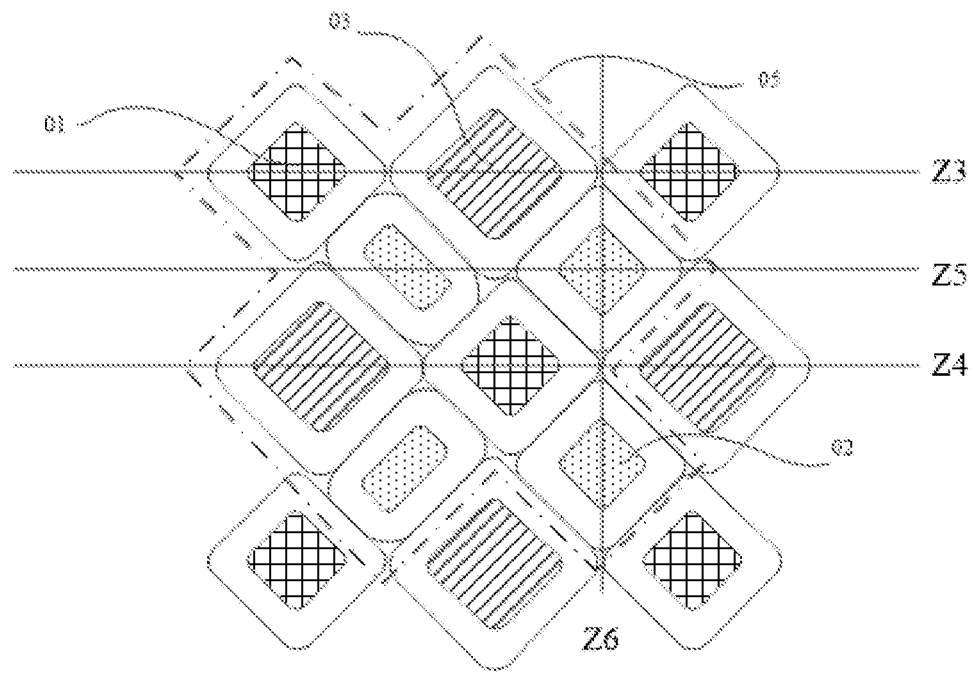

As shown in FIG. 7, in this embodiment, one pixel repetition unit 05 (a portion surrounded by a dotted box in FIG. 7) may include two third subpixels 03, two first subpixels 01 and four second subpixels 02.

As shown in FIG. 7, a line connecting the centers of at least a part of the first subpixels 01 may be approximately arranged on a third straight line Z3, a line connecting the centers of at least a part of the third subpixels 03 may be approximately arranged on a fourth straight line Z4, and the third straight line may be approximately parallel to the fourth straight line.

A line Z5 connecting the centers of the second subpixels 02 in the first direction (e.g., the row direction) may be approximately parallel to the first direction, and a line Z6 connecting the centers of the second subpixels 02 in the second direction (e.g., the column direction) may be approximately parallel to the second direction.

Figure 8:
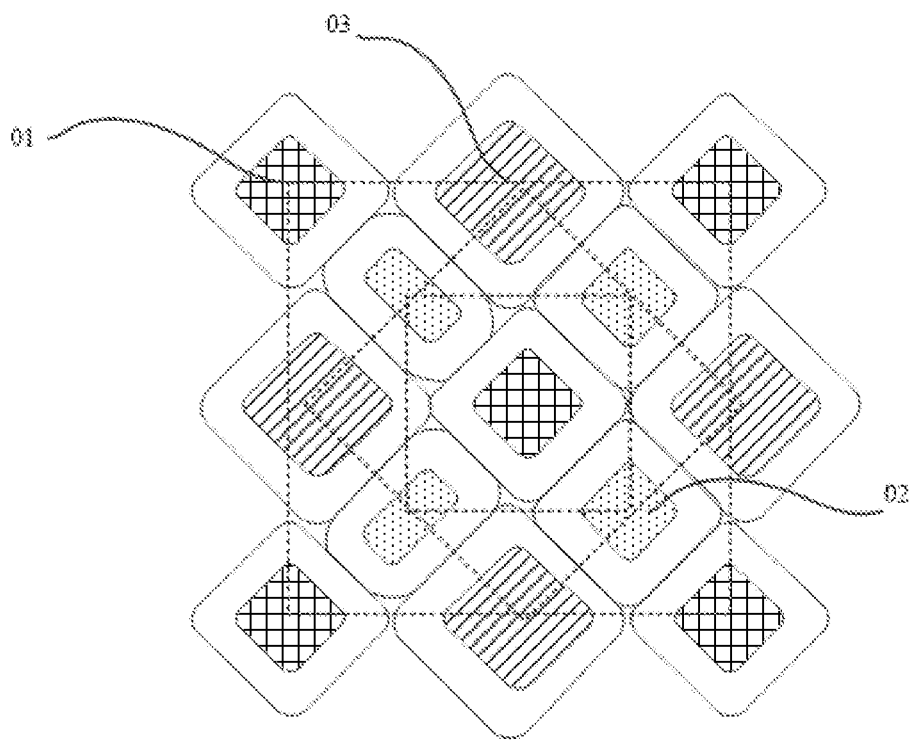

As shown in FIG. 8, in this embodiment, lines connecting the centers of the four first subpixels 01 at the sides or vertices of the second virtual polygon may be approximately a virtual rectangle, lines connecting the centers of the four third subpixels 03 at the sides or vertices of the second virtual polygon may be approximately a virtual rectangle, and lines connecting the centers of the four second subpixels 02 in the four first virtual quadrilaterals may be approximately a virtual rectangle.

Third Embodiment

Figure 9:
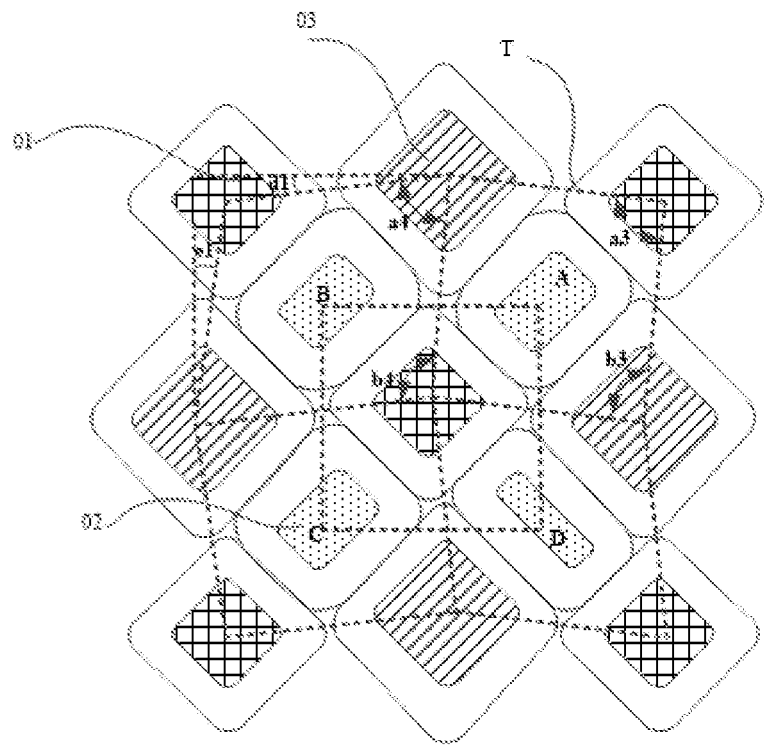

In this embodiment, as shown in FIG. 9, the first subpixels 01 and the third subpixels 03 may be arranged alternately to form a plurality of first subpixel rows, the second subpixels 02 may form a plurality of second subpixel rows, and the first subpixel rows and the second subpixel rows may be arranged alternately in a column direction. Lines connecting centers of two first subpixels 01 and two third subpixels 03 in two adjacent rows and two adjacent columns may form a first virtual quadrilateral T (a small dotted box in FIG. 9). The two first subpixels 01 may be arranged at two opposite vertices of the first virtual quadrilateral T, the two third subpixels 03 may be arranged at the other two opposite vertices of the first virtual quadrilateral T, and one second subpixel 02 may be arranged within the first virtual quadrilateral T. A center of the second subpixel 02 may, or may not, coincide with a center of the first virtual quadrilateral T.

As shown in FIG. 9, in the first virtual quadrilateral T, a line connecting the centers of the first subpixel 01 and the third subpixel 03 adjacent to each other in the column direction may not be parallel to the column direction, and there may exist an angle e1 therebetween, where e1 is greater than 0° and smaller than 90°. A line connecting the centers of the first subpixel 01 and the third subpixel 03 adjacent to each other in a row direction may not be parallel to the row direction, and there may exist an angle dl therebetween, where dl is greater than 0° and smaller than 90°. In other words, two sides of the first virtual quadrilateral T may not be parallel to the row direction, and the other two sides may not be parallel to the column direction. To be specific, each of e1 and dl may be within a range of 0°–30°, 0°–20°, 0°–10° or 0°–5°, e.g., 1°, 2°, 3° or 4°.

Four adjacent first virtual quadrilaterals T may be arranged in two columns and two rows to form a large virtual polygon (i.e., a largest dotted box in FIG. 9), i.e., the second virtual polygon. The first subpixels 01 may be arranged at a center and four vertices of the second virtual polygon, and the third subpixels 03 may be arranged at midpoints of sides of the second virtual polygon. Lines connecting the centers of the second subpixels 02 in the second virtual polygon may form a virtual rectangle.

In the above-mentioned pixel arrangement mode, brightness centers of the light-emitting pixel points formed by the first subpixels 01, the second subpixels 02 and the third subpixels 03 may be distributed more evenly, so it is able to improve the display effect of the display device.

In addition, as shown in FIG. 9, the second subpixels 02 may be arranged in a staggered manner, so as to increase the manufacture allowance of the metal mask. In this regard, it is able to increase a distance between openings of the mask for forming the second subpixels 02 in the case of a same aperture ratio, thereby to increase the manufacture of the metal mask and provide a higher resolution.

In this embodiment, a distance between orthogonal projections of the centers of the first subpixel 01 and the third subpixel 03 in different first subpixel rows onto a first straight line may be x, the first straight line may be parallel to the row direction, a distance between orthogonal projections of the centers of the first subpixel 01 and the third subpixel 03 in a same first subpixel row onto a second straight line may be y, the second straight line may be parallel to the column direction, and each of x and y may be within a range of 1 μm to 10 μm or 2 μm to 10 μm.

An interior angle a of the first virtual quadrilateral T smaller than 90° may meet the following equation:

$$a = 90° - \arctan\left(\frac{x}{P}\right) - \arctan\left(\frac{y}{P}\right);$$

for example, when P=57.9 μm, x=5 μm and y=5 μm, at this time the acute angle a=80.12°;

when P=57.9 μm, x=4 μm and y=8 μm, at this time the acute angle a=78.18°.

Alternatively, the interior angle a of the first virtual quadrilateral T may meet the following equation:

$$a = 90° - \left|\arctan\left(\frac{x}{P}\right) - \arctan\left(\frac{y}{P}\right)\right|;$$

for example, when P=57.9 μm, x=5 μm and y=5 μm, at this time the angle a=90°;

when P=57.9 μm, x=4 μm and y=8 μm, at this time the acute angle a=86.09°.

As shown in FIG. 9, in a specific embodiment of the present disclosure, an acute angle a4 of the first virtual quadrilateral T where the second subpixel B is located may be 80°, and an obtuse angle b4 may be 100°; an angle a3 of the first virtual quadrilateral T where the second subpixel A is located may be 90°, and an angle b3 may be 90°.

Figure 10:
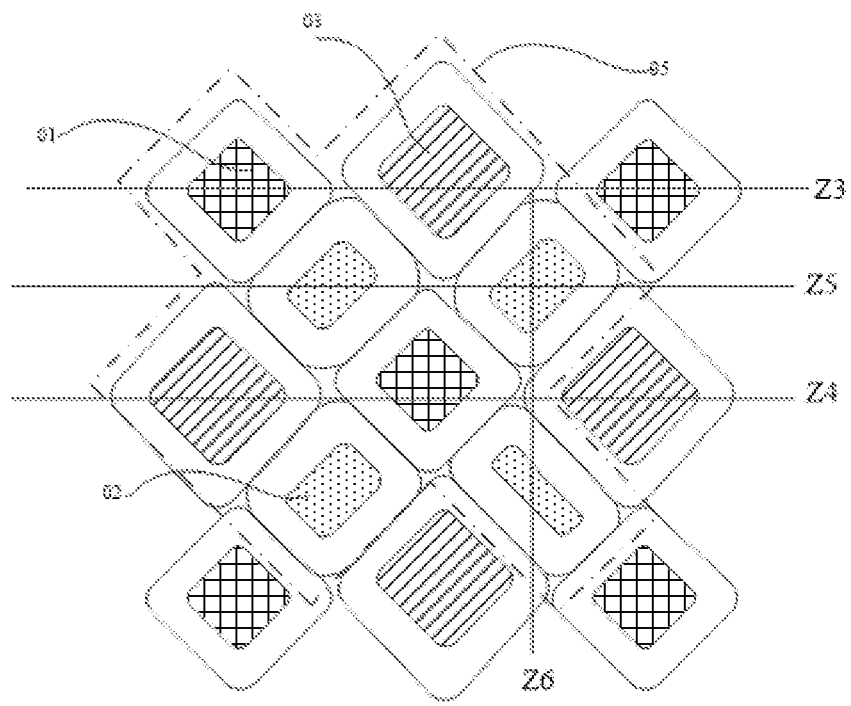

As shown in FIG. 10, in this embodiment, one pixel repetition unit 05 (a portion surrounded by a dotted box in FIG. 10) may include two third subpixels 03, two first subpixels 01 and four second subpixels 02.

As shown in FIG. 10, a line connecting the centers of at least a part of the first subpixels 01 may be approximately arranged on a third straight line Z3, a line connecting the centers of at least a part of the third subpixels 03 may be approximately arranged on a fourth straight line Z4, and the third straight line may be approximately parallel to the fourth straight line.

A line Z5 connecting the centers of the second subpixels 02 in the first direction (e.g., the row direction) may be approximately parallel to the first direction, and a line Z6 connecting the centers of the second subpixels 02 in the second direction (e.g., the column direction) may be approximately parallel to the second direction.

Figure 11:
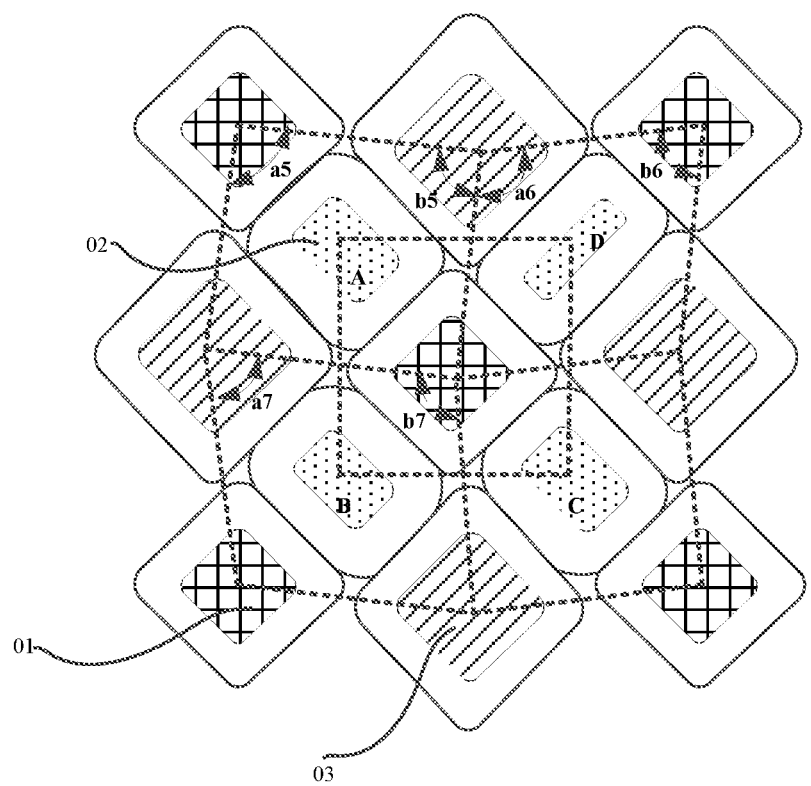

In another specific embodiment of the present disclosure, as shown in FIG. 11, an angle a5 of one first virtual quadrilateral T may be 94°, and an angle b5 may be 86°; an angle a6 of another first virtual quadrilateral T may be 102°, and an angle b6 may be 78°; and an angle a7 of yet another first virtual quadrilateral T may be 78°, and an angle b7 may be 102°.

In addition, a shape of the second subpixel 02 in this embodiment may have a length direction, the second subpixel 02 may have a maximum size in its length direction, and the length direction of the second subpixel 02 may cross the row direction and the column direction.

As shown in FIG. 11, for a second subpixel A, a size L' of the second subpixel in its length direction may approximately meet $$L' = L + \frac{x}{\sqrt{2}} - \frac{y}{\sqrt{2}};$$

a size M' of the second subpixel in its width direction may approximately meet $$M' = M - \frac{x}{\sqrt{2}} + \frac{y}{\sqrt{2}};$$

for example, when P=57.9 μm, the gap of the pixel definition layer of the display substrate=19 mm, L=22.08 µm, M=15.63 µm, x=5 µm and y=5 µm, at this time L'=19.25 µm and M'=18.46 µm.

For a second subpixel B, a size L' of the second subpixel in its length direction may approximately meet $$L' = L - \frac{x}{\sqrt{2}} - \frac{y}{\sqrt{2}};$$

a size M' of the second subpixel in its width direction may approximately meet $$M' = M + \frac{x}{\sqrt{2}} + \frac{y}{\sqrt{2}};$$

for example, when P=57.9 µm, the gap of the pixel definition layer of the display substrate=19 mm, L=22.08 µm, M=15.63 µm, x=5 µm and y=5 µm, at this time L'=24.12 µm and M'=13.6 µm.

For a second subpixel C, a size L' of the second subpixel in its length direction may approximately meet $$L' = L + \frac{x}{\sqrt{2}} + \frac{y}{\sqrt{2}};$$

a size M' of the second subpixel in its width direction may approximately meet $$M' = M - \frac{x}{\sqrt{2}} - \frac{y}{\sqrt{2}};$$

for example, when P=57.9 µm, the gap of the pixel definition layer of the display substrate=19 mm, L=22.08 µm, M=15.63 µm, x=5 µm and y=5 µm, at this time L'=30.57 µm and M'=7.15 µm.

For a second subpixel D, a size L' of the second subpixel in its length direction may approximately meet $$L' = L - \frac{x}{\sqrt{2}} + \frac{y}{\sqrt{2}};$$

a size M of the second subpixel in its width direction may approximately meet $$M' = M + \frac{x}{\sqrt{2}} - \frac{y}{\sqrt{2}};$$

for example, when P=57.9 µm, the gap of the pixel definition layer of the display substrate=19 mm, L=22.08 µm, M=15.63 µm, x=5 µm and y=5 µm, at this time L'=24.91 µm and M'=12.80 µm.

It should be appreciated that, the reference numeral 02 refers to all the second subpixels, while the second subpixel A, the second subpixel B, the second subpixel C and the second subpixel D are used to differentiate the second subpixels in a second virtual polygon from each other.

Based on a same inventive concept, the present disclosure further provides in some embodiments an OLED display panel including the above-mentioned display substrate, and the adjacent first virtual quadrilaterals are arranged in the row direction and the column direction with common sides. In other words, the first subpixel 01 and the third subpixel 03 at a common side of the adjacent first virtual quadrilaterals may be shared by two adjacent display substrates. A principle of the OLED display panel for solving the problems is similar to that of the display substrate, so the implementation of the OLED display panel may refer to that of the display substrate, which will not be further particularly defined herein.

The adjacent first virtual quadrilaterals may be arranged in the row direction and the column direction with common sides, i.e., two adjacent first virtual quadrilaterals in the row direction may share a side in the column direction, and two adjacent first virtual quadrilaterals in the column direction may share a side in the row direction.

When the adjacent first virtual quadrilaterals share a side, a side of one of the two adjacent first virtual quadrilaterals may be the same as that of the other one of the two adjacent first virtual quadrilaterals. However, the two adjacent first virtual quadrilaterals may be of different shapes, e.g., interior angles of the first virtual quadrilaterals may be different.

In some embodiments of the present disclosure, the OLED display panel may further include a pixel definition layer provided with a plurality of pixel definition layer openings. The first subpixels, the second subpixels and the third subpixels may correspond to the pixel definition layer openings respectively, and each of the first subpixels, the second subpixels and the third subpixels may be of a shape approximately same to a corresponding pixel definition layer opening.

In some embodiments of the present disclosure, the first subpixel may include multiple film layers at least partially covering a region of the pixel definition layer other than the pixel definition layer openings, and/or the second subpixel may include multiple film layers at least partially covering a region of the pixel definition layer other than the pixel definition layer openings, and/or the third subpixel may include multiple film layers at least partially covering a region of the pixel definition layer other than the pixel definition layer openings.

In some embodiments of the present disclosure, at least a part of the pixel definition layer openings may have different shapes or different areas.

In some embodiments of the present disclosure, at least a part of the pixel definition layer openings corresponding to the second subpixels may have different shapes or different areas.

In some embodiments of the present disclosure, minimum distances between at least a part of the pixel definition layer openings corresponding to the respective second subpixels and adjacent pixel definition layer openings are different.

Based on a same inventive concept, the present disclosure further provides in some embodiments a display device including the above-mentioned OLED display panel. The display device may be any product or member having a display function, e.g., mobile phone, table computer, television, display, laptop computer, digital photo frame or navigator. The implementation of the display device may refer to that of the display panel, and thus will not be further particularly defined herein.

Based on a same inventive concept, the present disclosure further provides in some embodiments a fine metal mask for manufacturing the above-mentioned display substrate, which includes a plurality of opening regions. The plurality of opening regions includes a first opening region corresponding to a position of the first subpixel, or a second opening region corresponding to a position of the second subpixel, or a third opening region corresponding to a position of the third subpixel. A principle of the fine mask plate for solving the problems is similar to that of the display substrate, so the implementation of the fine metal mask may refer to that of the display substrate, which will not be further particularly defined herein.

In some embodiments of the present disclosure, the first subpixel includes multiple film layers, the second subpixel includes multiple film layers, the third subpixel includes multiple film layers, a shape of the first opening region is approximately same to a shape and distribution of at least one of the film layers of the first subpixel, a shape of the third opening region is approximately same to a shape and distribution of at least one of the film layers of the third subpixel, and a shape and distribution of the second opening region are approximately same to a shape and distribution of at least one of the film layers of the second subpixel.

In some embodiments of the present disclosure, at least two of the plurality of second opening regions of the fine metal mask corresponding to the positions of the second subpixels may have different shapes or different areas.

Figure 12:
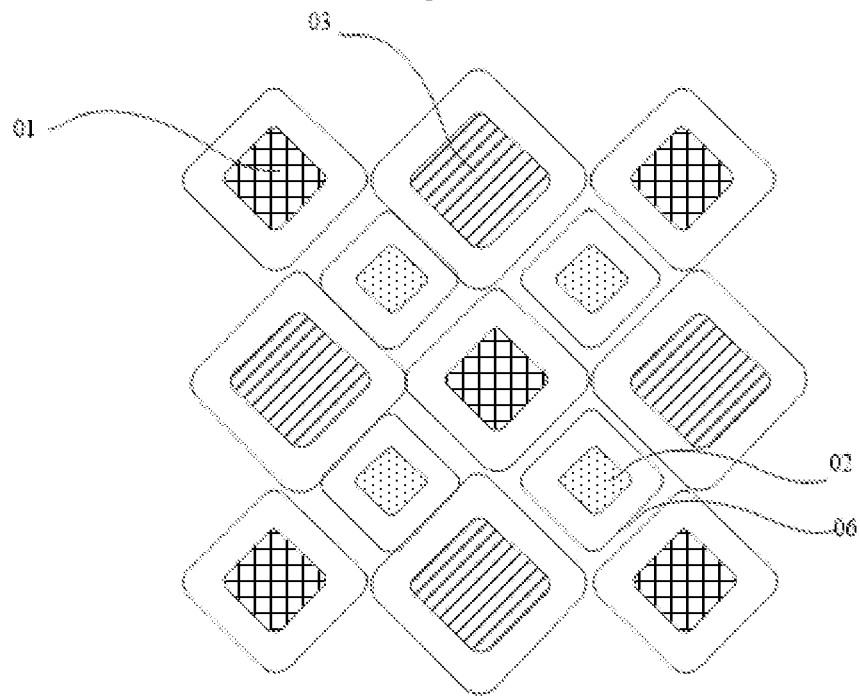

In a possible embodiment of the present disclosure, as shown in FIG. 12, a shape of a second opening region for forming at least one film layer of the second subpixel is represented by a solid box 06. The four second subpixels 02 in the second virtual polygon may have a same shape, and the second opening regions may have a same shape too, so as to simplify a patterning process.

Figure 13:
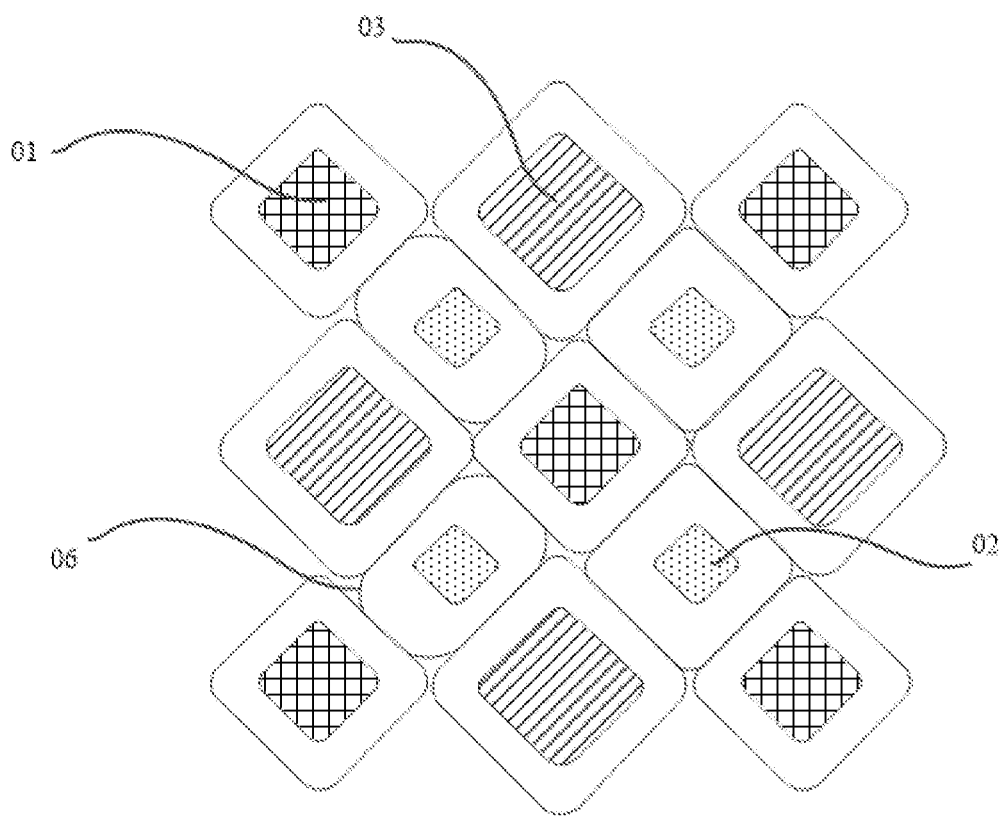

In another possible embodiment of the present disclosure, as shown in FIG. 13, a shape of a second opening region for forming at least one film layer of the second subpixel is represented by a solid box 06. The four second subpixels 02 in the second virtual polygon may have a same shape, and the second opening regions may have different shapes, so as to increase a process allowance during the evaporation, thereby to improve the yield of the display panel.

In a possible embodiment of the present disclosure, in the fine metal mask according to the embodiments of the present disclosure, a distance between the adjacent second opening regions may be greater than or equal to a process threshold distance, so as to meet the requirements on a process.

It should be further appreciated that, the above embodiments have been described in a progressive manner, and the same or similar contents in the embodiments have not been repeated, i.e., each embodiment has merely focused on the difference from the others. Especially, the method embodiments are substantially similar to and may refer to the product embodiments, and thus have been described in a simple manner.

Unless otherwise defined, any technical or scientific term used herein shall have the common meaning understood by a person of ordinary skills. Such words as "first" and "second" used in the specification and claims are merely used to differentiate different components rather than to represent any order, number or importance. Such words as "include" or "including" intends to indicate that an element or object before the word contains an element or object or equivalents thereof listed after the word, without excluding any other element or object. Such words as "connect/connected to" or "couple/connected to" may include electrical connection, direct or indirect, rather than to be limited to physical or mechanical connection. Such words as "on", "under", "left" and "right" are merely used to represent relative position relationship, and when an absolute position of the object is changed, the relative position relationship might be changed accordingly.

It should be appreciated that, in the case that such an element as layer, film, region or substrate is arranged "on" or "under" another element, it may be directly arranged "on" or "under" the other element, or an intermediate element may be arranged therebetween.

In the above description, the features, structures, materials or characteristics may be combined in any embodiment or embodiments in an appropriate manner.

The above embodiments are for illustrative purposes only, but the present disclosure is not limited thereto. A person skilled in the art may make further modifications and improvements without departing from the spirit of the present disclosure, and these modifications and improvements shall also fall within the scope of the present disclosure. Therefore, a protection scope of the present disclosure is defined by the protection scope of claims.

What is claimed is:

1. A display substrate, comprising a plurality of first subpixels, a plurality of second subpixels and a plurality of third subpixels, wherein in a first direction, the first subpixels and the third subpixels are arranged alternately to form a plurality of first subpixel rows, and the second subpixels form a plurality of second subpixel rows; the first subpixel rows and the second subpixel rows are arranged alternately in a second direction, lines connecting centers of two first subpixels and two third subpixels in two adjacent rows and two adjacent columns form a first virtual quadrilateral, the two first subpixels are arranged at respective two opposite vertices of the first virtual quadrilateral, the first virtual quadrilateral comprises an interior angle a being not equal to 90°, and the second subpixel is arranged within the first virtual quadrilateral; and in the first virtual quadrilateral, a distance between an orthogonal projection of a center of a first subpixel onto a first straight line and an orthogonal projection of a center of a third subpixel onto the first straight line is x, where the first subpixel and the third subpixel are arranged in different first subpixel rows, and the first straight line is parallel to the first direction;

a distance between an orthogonal projection of a center of a first subpixel onto a second straight line and an orthogonal projection of a center of a third subpixel onto the second straight line is y, where the first subpixel and the third subpixel are arranged in a same first subpixel row, and the second straight line is parallel to the second direction;

the interior angle a of the first virtual quadrilateral is within a range of (h−10°, h+10°, and h is calculated through any one of the following equations:

$$h = 90° - \arctan\left(\frac{x}{P}\right) - \arctan\left(\frac{y}{P}\right);$$

$$h = 90° + \arctan\left(\frac{x}{P}\right) + \arctan\left(\frac{y}{P}\right);$$

$$h = 90 - \left|\arctan\left(\frac{x}{P}\right) - \arctan\left(\frac{y}{P}\right)\right|;$$

$$h = 90° + \left|\arctan\left(\frac{x}{P}\right) - \arctan\left(\frac{y}{P}\right)\right|;$$

where P represents a distance between centers of two second subpixels proximate to each other in the second subpixel row, wherein x is within a range of 1 μm to 10 μm, and y is within a range of 1 μm to 10 μm; and the interior angle a is greater than or equal to 70° and smaller than 90°.

2. The display substrate according to claim 1, wherein a line connecting centers of the first subpixel and the third subpixel adjacent to each other in the first direction is parallel to the first direction, a line connecting centers of the first subpixel and the third subpixel adjacent to each other in the second direction is angled relative to the second direction at an angle c, and the angle c is greater than 0° and not equal to 90°; or the line connecting the centers of the first subpixel and the third subpixel adjacent to each other in the first direction is angled relative to the first direction at an angle d, the line connecting the centers of the first subpixel and the third subpixel adjacent to each other in the second direction is angled relative to the second direction at an angle e, the angle d is greater than 0° and not equal to 90°, and the angle e is greater than 0° and not equal to 90°, wherein the first direction is approximately perpendicular to the second direction, the first direction is one of a row direction and a column direction, and the second direction is the other one of the row direction and the column direction.

3. The display substrate according to claim 1, wherein a shape of the second subpixel is selected from any one of a polygon, an axisymmetric pattern and a centrosymmetric pattern, the shape of the second subpixel is provided with a length direction, the length direction of the second subpixel is an extension direction of a longest side of the polygon, a direction of a long axis of the axisymmetric pattern, or a direction of a line connecting two end points of a group of opposite and parallel sides of the centrosymmetric pattern, the two end points are at a same side of a symmetric center, and the length direction of the second subpixel crosses the first direction and the second direction, wherein x=0, a size L' of the second subpixel in the length direction of the second subpixel approximately satisfies L'=(L+y/√2)±5 μm, and a size M' of the second subpixel in a width direction of the second subpixel approximately satisfies M'=(M−y/√2)±5 μm; or a size L' of the second subpixel in the width direction of the second subpixel approximately satisfies L'=(L−y/√2)±5 μm, and a size M' of the second subpixel in the length direction of the second subpixel approximately satisfies M'=+y/√2±5 μm; or wherein y=0, the size L' of the second subpixel in the length direction of the second subpixel approximately satisfies L'=(L+x/√2)±5 μm, and the size M' of the second subpixel in the width direction of the second subpixel approximately satisfies M'=— x/√2)±5 μm; or the size L' of the second subpixel in the width direction of the second subpixel approximately satisfies L'=(L−x/√2)±5 μm, and the size M' of the second subpixel in the length direction of the second subpixel approximately satisfies M'=+(M'x/√2)±5 μm, wherein the width direction and the length direction of the same second subpixel are approximately perpendicular to each other, and each of L and M has a preset value, a value of L is within a range of 10 μm to 50 μm, and a value of M is within a range of 5 μm to 40 μm.

4. The display substrate according to claim 1, wherein a shape of the second subpixel is provided with a length direction, the second subpixel has a maximum size in the length direction of the second subpixel, the length direction of the second subpixel crosses the first direction and the second direction, x is greater than 0, and y is greater than 0, wherein a size L' of the second subpixel in the length direction of the second subpixel approximately satisfies $$L' = \left(L + \frac{x}{\sqrt{2}} - \frac{y}{\sqrt{2}}\right) \pm 5 \ \mu m,$$

and a size M' of the second subpixel in a width direction of the second subpixel approximately satisfies $$M' = \left(M - \frac{x}{\sqrt{2}} + \frac{y}{\sqrt{2}}\right) \pm 5 \ \mu m;$$

or the size L' of the second subpixel in the length direction of the second subpixel approximately satisfies $$L' = \left(L + \frac{x}{\sqrt{2}} + \frac{y}{\sqrt{2}}\right) \pm 5 \ \mu m,$$

and the size M' of the second subpixel in the width direction of the second subpixel approximately satisfies $$M' = \left(M - \frac{x}{\sqrt{2}} - \frac{y}{\sqrt{2}}\right) \pm 5 \ \mu m;$$

or the size L' of the second subpixel in the length direction of the second subpixel approximately satisfies $$L' = \left(L - \frac{x}{\sqrt{2}} - \frac{y}{\sqrt{2}}\right) \pm 5 \ \mu m,$$

and the size M' of the second subpixel in the width direction of the second subpixel approximately satisfies $$M' = \left(M + \frac{x}{\sqrt{2}} + \frac{y}{\sqrt{2}}\right) \pm 5 \ \mu m;$$

or the size L' of the second subpixel in the length direction of the second subpixel approximately satisfies $$L' = \left(L - \frac{x}{\sqrt{2}} + \frac{y}{\sqrt{2}}\right) \pm 5 \ \mu m,$$

and the size M' of the second subpixel in the width direction of the second subpixel approximately satisfies $$M' = \left(M + \frac{x}{\sqrt{2}} - \frac{y}{\sqrt{2}}\right) \pm 5 \ \mu m,$$

where each of L and M has a preset value, a value of L is within a range of 10 μm to 50 μm, and a value of M is within a range of 5 μm to 40 μm.

5. The display substrate according to claim 1, wherein
sides of four first virtual quadrilaterals arranged in two columns and two rows are shared to form a second virtual polygon, and the second virtual polygon comprises four second subpixels, five first subpixels and four third subpixels;

the four second subpixels are arranged in the four first virtual quadrilaterals respectively, one of the first subpixels is surrounded by the four second subpixels, the other four first subpixels and the four third subpixels are arranged alternately and respectively at sides or vertices of the second virtual polygon in a clockwise or counterclockwise direction of sides of the second virtual polygon; and lines connecting centers of the four first subpixels at the sides or vertices of the second virtual polygon approximately form a virtual parallelogram, and/or lines connecting centers of the four third subpixels at the sides or vertices of the second virtual polygon approximately form a virtual parallelogram, and/or lines connecting centers of the four second subpixels in the four first virtual quadrilaterals approximately form a virtual parallelogram.

6. The display substrate according to claim 5, wherein a line connecting the centers of at least a part of the first subpixels is approximately arranged on a third straight line, a line connecting the centers of at least a part of the third subpixels is approximately arranged on a fourth straight line, and the third straight line is approximately parallel to the fourth straight line.

7. The display substrate according to claim 6, wherein the third straight line does not coincide with the fourth straight line, and both the third straight line and the fourth straight line are approximately parallel to the first direction; or the third straight line does not coincide with the fourth straight line, and both the third straight line and the fourth straight line are approximately parallel to the second direction, wherein a line connecting the centers of at least a part of the second subpixels in a same second pixel row is approximately arranged on a fifth straight line, and the fifth straight line is approximately parallel to the third straight line and the fourth straight line.

8. The display substrate according to claim 5, wherein the display substrate comprises a plurality of pixel repetition units, the pixel repetition unit comprises two first subpixels and two third subpixels in the same first virtual quadrilateral, and four second subpixels, wherein the four second subpixels are arranged in a same second virtual quadrilateral as one of the two first subpixels, and surround the first subpixel.

9. The display substrate according to claim 5, wherein the four second subpixels in the first virtual quadrilateral are a second subpixel A, a second subpixel B, a second subpixel C and a second subpixel D in a counterclockwise direction, wherein the second subpixel A, the second subpixel B, the second subpixel C and the second subpixel D are of a same shape; or the second subpixel A and the second subpixel B are of a same shape, the second subpixel C and the second subpixel D are of a same shape, and the second subpixel A and the second subpixel C are of different shapes; or the second subpixel A and the second subpixel D are of a same shape, the second subpixel C and the second subpixel B are of a same shape, and the second subpixel A and the second subpixel C are of different shapes; or the second subpixel A and the second subpixel C are of a same shape, and the second subpixel A, the second subpixel B and the second subpixel D are of different shapes; or the second subpixel A, the second subpixel B, the second subpixel C and the second subpixel D are of different shapes.

10. The display substrate according to claim 1, wherein a line connecting the centers of the second subpixels arranged in the first direction is approximately parallel to the first direction, and a line connecting the centers of the second subpixels arranged in the second direction is approximately parallel to the second direction;

a part of the second subpixels has different shapes and/or areas;

a minimum distance between a boundary of the second subpixel and the centers of the first subpixels surrounding the second subpixel is a first distance, a minimum distance between the boundary of the second subpixel and the centers of the third subpixels surrounding the second subpixel is a second distance, and the first distance is not equal to the second distance.

11. The display substrate according to claim 1, wherein each of the first subpixels has a same area, and each of the third subpixels has a same area;

the area of the first subpixel is S, an area of the second subpixel is f*S, and the area of the third subpixel is g*S, where $0.5 \leq f \leq 0.8$ and $1 \leq g \leq 2.2$.

12. The display substrate according to claim 1, wherein each of the first subpixels is of an approximately same shape; and/or each of the third subpixels is of an approximately same shape;

a shape of each of the first subpixel, the second subpixel and the third subpixel is any one of a polygon, a circle or an oval, wherein a shape of each of the first subpixel, the second subpixel and the third subpixel is selected from any one of a quadrilateral, a hexagon, an octagon, a quadrilateral with a rounded angle, a hexagon with a rounded angle, an octagon with a rounded angle, a circle and an oval;

the first subpixel is a red subpixel, the third subpixel is a blue subpixel and the second subpixel is a green subpixel; or the first subpixel is a blue subpixel, the third subpixel is a red subpixel and the second subpixel is a green subpixel; or the first subpixel is a green subpixel, the third subpixel is a red subpixel and the second subpixel is a blue subpixel; or the first subpixel is a green subpixel, the third subpixel is a blue subpixel and the second subpixel is a red subpixel.

13. An Organic Light-Emitting Diode (OLED) display panel, comprising the display substrate according to claim 1.

14. The OLED display panel according to claim 13, further comprising a pixel definition layer provided with a plurality of pixel definition layer openings, wherein the first subpixels, the second subpixels and the third subpixels correspond to the pixel definition layer openings respectively, and a shape of each of the first subpixels, the second subpixels and the third subpixels is approximately same to a shape of the respective pixel definition layer opening.

15. The OLED display panel according to claim 14, wherein the first subpixel comprises multiple film layers at least partially covering a region other than the pixel definition layer openings, and/or the second subpixel comprises multiple film layers at least partially covering a region other than the pixel definition layer openings, and/or the third subpixel comprises multiple film layers at least partially covering a region other than the pixel definition layer openings.

16. The OLED display panel according to claim 14, wherein at least a part of the pixel definition layer openings have different shapes or different areas; or
   at least a part of the pixel definition layer openings corresponding to the second subpixels have different shapes or different areas; or
   minimum distances between at least a part of the pixel definition layer openings corresponding to the respective second subpixels and adjacent pixel definition layer openings are different.

17. A display device, comprising the OLED display panel according to claim 13.

18. A fine metal mask configured for manufacturing the display substrate according to claim 1, wherein the fine metal mask comprises a plurality of opening regions, wherein the plurality of opening regions comprises a first opening region corresponding to a position of the first subpixel, or a second opening region corresponding to a position of the second subpixel, or a third opening region corresponding to a position of the third subpixel.

19. The fine metal mask according to claim 18, wherein the first subpixel comprises multiple film layers, the second subpixel comprises multiple film layers, the third subpixel comprises multiple film layers, a shape of the first opening region is approximately same to a shape and distribution of at least one of the film layers of the first subpixel, a shape of the third opening region is approximately same to a shape and distribution of at least one of the film layers of the third subpixel, and a shape and distribution of the second opening region are approximately same to a shape and distribution of at least one of the film layers of the second subpixel,
   wherein at least two of the plurality of second opening regions corresponding to the positions of the second subpixels have different shapes or different areas.

* * * * *